US008379884B2

(12) United States Patent
Horibe et al.

(10) Patent No.: US 8,379,884 B2
(45) Date of Patent: Feb. 19, 2013

(54) SOUND SIGNAL TRANSMITTER-RECEIVER

(75) Inventors: Ryusuke Horibe, Daito (JP); Shigeo Maeda, Daito (JP); Fuminori Tanaka, Daito (JP)

(73) Assignee: Funai Electric Co., Ltd., Osaka (JP)

( * ) Notice: Subject to any disclaimer, the term of this patent is extended or adjusted under 35 U.S.C. 154(b) by 654 days.

(21) Appl. No.: 12/355,356

(22) Filed: Jan. 16, 2009

(65) Prior Publication Data

US 2009/0185696 A1 Jul. 23, 2009

(30) Foreign Application Priority Data

Jan. 17, 2008 (JP) ................................ 2008-008161

(51) Int. Cl.
*H03F 99/00* (2009.01)
*H04R 3/00* (2006.01)

(52) U.S. Cl. ........ 381/120; 381/122; 381/123; 381/355; 455/90.2

(58) Field of Classification Search .................. 381/120, 381/355, 123, 122; 455/90.2
See application file for complete search history.

(56) References Cited

U.S. PATENT DOCUMENTS

| | | | | |
|---|---|---|---|---|
| 6,671,379 | B2 * | 12/2003 | Nemirovski | 381/93 |
| 2002/0037088 | A1 * | 3/2002 | Dickel et al. | 381/317 |
| 2003/0147538 | A1 * | 8/2003 | Elko | 381/92 |
| 2008/0232606 | A1 * | 9/2008 | Holloway et al. | 381/71.8 |
| 2009/0147968 | A1 * | 6/2009 | Inoda et al. | 381/94.1 |

FOREIGN PATENT DOCUMENTS

| | | |
|---|---|---|
| JP | 3-147000 | 6/1991 |
| JP | 5-30177 | 2/1993 |
| JP | 6-6441 | 1/1994 |
| JP | 7-240782 | 9/1995 |
| JP | 8-18630 | 1/1996 |
| JP | 9-37380 | 2/1997 |
| JP | 2000-101683 | 4/2000 |

OTHER PUBLICATIONS

Patent Abstracts of Japan for Japanese Publication No. 03-147000, Publication date Jun. 21, 1991 (1 page).
Patent Abstracts of Japan for Japanese Publication No. 08-018630, Publication date Jan. 19, 1996 (1 page).
Patent Abstracts of Japan for Japanese Publication No. 05-030177, Publication date Feb. 5, 1993 (1 page).
Patent Abstracts of Japan for Japanese Publication No. 2000-101683, Publication date Apr. 7, 2000 (1 page).
Patent Abstracts of Japan for Japanese Publication No. 07-240782, Publication date Sep. 12, 1995 (1 page).
Patent Abstracts of Japan for Japanese Publication No. 09-037380, Publication date Feb. 7, 1997 (1 page).
Japanese Office Action for patent application No. 0081612008, Mailed Oct. 20, 2009, and English Translation thereof, 10 pages.
Patent Abstracts of Japan for patent application with Publication No. 06-006441, Publication Date: Jan. 14, 1994, 1 page.

* cited by examiner

*Primary Examiner* — Asok K Sarkar
*Assistant Examiner* — Dmitriy Yemelyanov
(74) *Attorney, Agent, or Firm* — Osha Liang LLP

(57) ABSTRACT

A sound signal transmitter-receiver includes a differential microphone for receiving sounds respectively at first and second points to convert the receiving sounds into a transmission sound signal; a transmission-reception unit for receiving an incoming signal as a reception sound signal; an addition unit for adding the reception sound signal from the transmission-reception unit and the transmission sound signal to produce an addition signal; and a speaker outputting sound based on the addition signal.

13 Claims, 14 Drawing Sheets

P1/P2→ACOUSTO-ELECTRIC CONVERSION
→v1 and v2→FIRST SUBTRACTING UNIT→(v1-v2)

(Pf-Pb)→ACOUSTO-ELECTRIC CONVERSION→(v1-v2)

IN THE CASE OF DELAY AMOUNT $\tau = 0$

IN THE CASE OF DELAY AMOUNT $\tau = d/c$

SOUND SIGNAL TRANSMITTER-RECEIVER

BACKGROUND OF THE INVENTION

1. Field of the Invention

The present invention relates to a sound signal transmitter-receiver, particularly to a sound signal transmitter-receiver which receives a transmitting voice (sound) from a talker to transmit a transmission sound signal to the outside while receiving a reception sound signal from the outside to make a received voice (sound) to the talker.

2. Description of the Related Art

Conventionally, there is known a sound signal transmitter-receiver in which a reception sound signal is received from the outside to make a received voice to a talker while a transmitting voice is received from the talker to transmit a transmission sound signal to the outside. A technique in which the talker easily catches his or her transmitting voice even in a noisy environment and a technique in which the other party easily catches the received voice even in a noisy environment are also proposed.

For example, a configuration disclosed in Japanese Patent Laying-Open No. 09-037380 includes a noise detector attached to an outer wall of a head set; first and second adaptive filters into which an output signal of the noise detector is fed; a transmitting microphone placed near the mouth of the talker; a control speaker placed in an inner wall of the head set; and an error detector placed in the inner wall of the head set, wherein an output signal of the first adaptive filter is subtracted from an output signal of the transmitting microphone, a factor of the first adaptive filter is updated such that the subtracted signal is small, a factor of the second adaptive filter is updated such that an output signal of the error detector is small, the output signal of the second adaptive filter, the subtracted signal, and a receiving signal from a communication device are added and fed into the control speaker, and the subtracted signal is set as a transmitting output signal for the communication device.

Japanese Patent Laying-Open No. 07-240782 discloses a technique in which a transmission sound signal obtained from a transmitting microphone through an A/D converter is transmitted as a sidetone to a receiving-side adder through a variable gain amplifier and the transmission sound signal is added to a received voice. A background noise level in the transmission sound signal is detected by a background noise level detector, and a gain of the variable gain amplifier is controlled according to a detected background noise level, thereby controlling the sidetone level.

Japanese Patent Laying-Open No. 2000-101683 discloses a technique in which a noise/voice separation unit separates the transmission sound signal from a voice input unit into a noise and a transmitting voice, a signal addition unit adds the transmission sound signal from the noise/voice separation unit to a decoded sound signal decoded by a voice decoding unit according to noise power computed by a noise power computing unit. A level control unit controls the level of the decoded sound signal from the signal addition unit according to the ratio of the noise power computed by the noise power computing unit and decoded voice power computed by a decoded voice power computing unit, and a voice output unit performs D/A conversion on the decoded sound signal from the level control unit and supplies the converted sound signal through a speaker.

Japanese Patent Laying-Open No. 05-030177 discloses a sidetone control circuit of a transmitter-receiver including a level computing device that detects a background noise level when the talker does not make a voice, a voice/noise determination device that detects a noise zone of the transmitting signal, and an attenuation amount controller that supplies a control signal so as to increase the attenuation amount of a variable attenuator when the noise zone is at a high noise level.

Japanese Patent Laying-Open No. 08-018630 discloses a noise suppression hand set having a telephone transmitter and a telephone receiver, the hand set including an ear microphone provided in an ear piece surface to detect a sound between the ear piece and the ear, a noise microphone provided in an outer surface of the hand set to detect the noise. A receiving amplifying circuit superimposes the output of the noise microphone on a receiving input such that the noise that flows between the ear and the ear piece surface becomes the minimum. A transmitting amplifying circuit superimposes the output of the noise microphone on a transmitting output such that the noise included in the transmitting signal becomes the minimum.

In addition, Japanese Patent Laying-Open No. 03-147000 discloses a voice input device including two microphone units, means for converting an electric output of each microphone unit into an envelope signal as electric power, means for obtaining a difference signal between the envelope signals, and means for obtaining a voice zone detecting signal of the voice input device using the difference signal output.

However, for example, in the techniques disclosed in Japanese Patent Laying-Open Nos. 09-037380 and 08-018630, because the noise is reduced using the adaptive filter or a noise canceller, an unsteady noise is hardly reduced while a steady noise is highly reduced. In the techniques disclosed in Japanese Patent Laying-Open Nos. 07-240782, 2000-101683, and 05-030177, the talker hardly catches the transmitting voice because the gain of the transmitting voice is also controlled along with the gain of the noise.

SUMMARY OF THE INVENTION

The present invention was made to overcome the above problems, and an object of the present invention is to provide a sound signal transmitter-receiver with which the talker and the other party easily catch the transmitting voice of the talker by reducing the background noise even if the talker is in a noisy environment.

In order to solve the above problems, in accordance with an aspect of the present invention, a sound signal transmitter-receiver includes a differential microphone for receiving sounds respectively at first and second points to convert the receiving sounds into a transmission sound signal by detecting an acoustic or electric difference between the receiving sounds; a transmission-reception unit for receiving an incoming signal as a reception sound signal and transmitting the transmission sound signal; an addition unit for adding the reception sound signal from the transmission-reception unit and the transmission sound signal to produce an addition signal; and a speaker outputting sound based on the addition signal.

Preferably, the differential microphone includes a first microphone converting the sound received at the first point into a first electric signal; a second microphone converting the sound received at the second point into a second electric signal; and a signal production unit for producing the transmission sound signal from a difference between the first electric signal and the second electric signal.

Preferably, the signal production unit includes a first subtracting unit for obtaining a difference signal between the first electric signal and the second electric signal; and an amplifying unit for amplifying the difference signal.

Preferably, the sound signal transmitter-receiver further includes a first determination unit for determining whether or not the amplitude or power of the first electric signal is larger than a predetermined threshold; and a first switching unit for switching a signal fed into the addition unit based on the determination result, wherein the first switching unit feeds the transmission sound signal into the addition unit when the amplitude or power of the first electric signal is larger than the predetermined threshold, and feeds one of the first electric signal and the second electric signal into the addition unit when the amplitude or power of the first electric signal is not larger than the predetermined threshold.

Preferably, the sound signal transmitter-receiver further includes a noise detection unit for extracting a noise signal based on the first electric signal and the second electric signal and determining whether or not the amplitude or power of the noise signal is larger than a predetermined threshold; and a second switching unit for switching a signal fed into the addition unit based on the determination result, wherein the second switching unit feeds the transmission sound signal into the addition unit when the amplitude or power of the noise signal is larger than a predetermined threshold, and feeds one of the first electric signal and the second electric signal into the addition unit when the amplitude or power of the noise signal is not larger than the predetermined threshold.

The noise detection unit preferably has a cardioid characteristic. The noise detection unit preferably includes a delay unit for delaying one of the first electric signal and the second electric signal by a predetermined time; a second subtracting unit for producing the noise signal from a difference between the delayed one of the signals and the other signal; and a second determination unit for determining whether or not the amplitude or power of the noise signal is larger than the predetermined threshold.

The sound signal transmitter-receiver preferably further includes an accepting unit for accepting a switching command from the outside; and a third switching unit for switching between the transmission sound signal and one of the first electric signal and the second electric signal in response to the switching command to feed the switched signal into the addition unit.

The sound signal transmitter-receiver preferably further includes a first determination unit for determining whether or not the amplitude or power of the first electric signal is larger than a predetermined threshold; and a fourth switching unit connected between the signal production unit and the addition unit, wherein the fourth switching unit feeds the transmission sound signal into the addition unit when the amplitude or power of the first electric signal is larger than the predetermined threshold, and does not feed the transmission sound signal into the addition unit when the amplitude or power of the first electric signal is not larger than the predetermined threshold.

The sound signal transmitter-receiver preferably further includes a noise detection unit for extracting a noise signal based on the first electric signal and the second electric signal and determining whether or not the amplitude or power of the noise signal is larger than a predetermined threshold; and a fifth switching unit connected between the signal production unit and the addition unit, wherein the fifth switching unit feeds the transmission sound signal into the addition unit when the amplitude or power of the noise signal is larger than the predetermined threshold, and does not feed the transmission sound signal into the addition unit when the amplitude or power of the noise signal is not larger than the predetermined threshold.

The sound signal transmitter-receiver preferably further includes a sixth switching unit connected between the signal production unit and the addition unit; and an accepting unit for accepting a switching command from the outside, wherein the sixth switching unit changes the input/non-input state of the transmission sound signal into the addition unit in response to the switching command.

The speaker is preferably an earphone or a sound-isolating headphone.

In accordance with another aspect of the present invention, a method of transmitting and receiving a sound signal includes the steps of receiving sounds respectively at first and second points to convert the receiving sounds into a transmission sound signal by detecting an acoustic or electric difference between the receiving sounds; transmitting the transmission sound signal; receiving an incoming signal as a reception sound signal; adding the reception sound signal and the transmission sound signal to produce an addition signal; and outputting sound based on the addition signal.

Preferably, the step of receiving sounds includes the steps of converting the sound received at first point into a first electric signal; converting the sound received at second point into a second electric signal; and producing the transmission sound signal from a difference between the first electric signal and the second electric signal.

Preferably, the step of producing the transmission sound signal includes the steps of obtaining a difference signal between the first electric signal and the second electric signal; and amplifying the difference signal.

Preferably, the sound signal transmitting-receiving method further includes the step of determining whether or not the amplitude or power of the first electric signal is larger than a predetermined threshold, wherein the step of producing the addition signal includes the steps of adding the transmission sound signal to the reception sound signal when the amplitude or power of the first electric signal is larger than the predetermined threshold; and adding one of the first electric signal and the second electric signal to the reception sound signal when the amplitude or power of the first electric signal is not larger than the predetermined threshold.

Preferably, the sound signal transmitting-receiving method further includes the step of determining whether or not the amplitude or power of a noise signal is larger than a predetermined threshold by extracting the noise signal based on the first electric signal and the second electric signal, wherein the step of producing the addition signal includes the steps of adding the transmission sound signal to the reception sound signal when the amplitude or power of the noise signal is larger than the predetermined threshold; and adding one of the first electric signal and the second electric signal to the reception sound signal when the amplitude or power of the noise signal is not larger than the predetermined threshold.

Preferably, the sound signal transmitting-receiving method further includes the steps of accepting a switching command from the outside; and switching between the transmission sound signal and one of the first electric signal and the second electric signal in response to the switching command to add the switched signal to the reception sound signal.

Preferably, the sound signal transmitting-receiving method further includes the step of determining whether or not an amplitude or power of the first electric signal is larger than a predetermined threshold, wherein the step of producing the addition signal further includes the step of adding the transmission sound signal to the reception sound signal when the amplitude or power of the first electric signal is larger than the predetermined threshold.

Preferably, the sound signal transmitting-receiving method further includes the step of extracting a noise signal based on the first electric signal and the second electric signal and determining whether or not the amplitude or power of the noise signal is larger than a predetermined threshold, wherein the step of producing the addition signal further includes the step of adding the transmission sound signal to the reception sound signal when the amplitude or power of the noise signal is larger than the predetermined threshold.

Thus, the present invention can provide a sound signal transmitter-receiver in which the talker and the other party easily catch the transmitting voice of the talker by reducing the background noise even if the talker is in a noisy environment.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
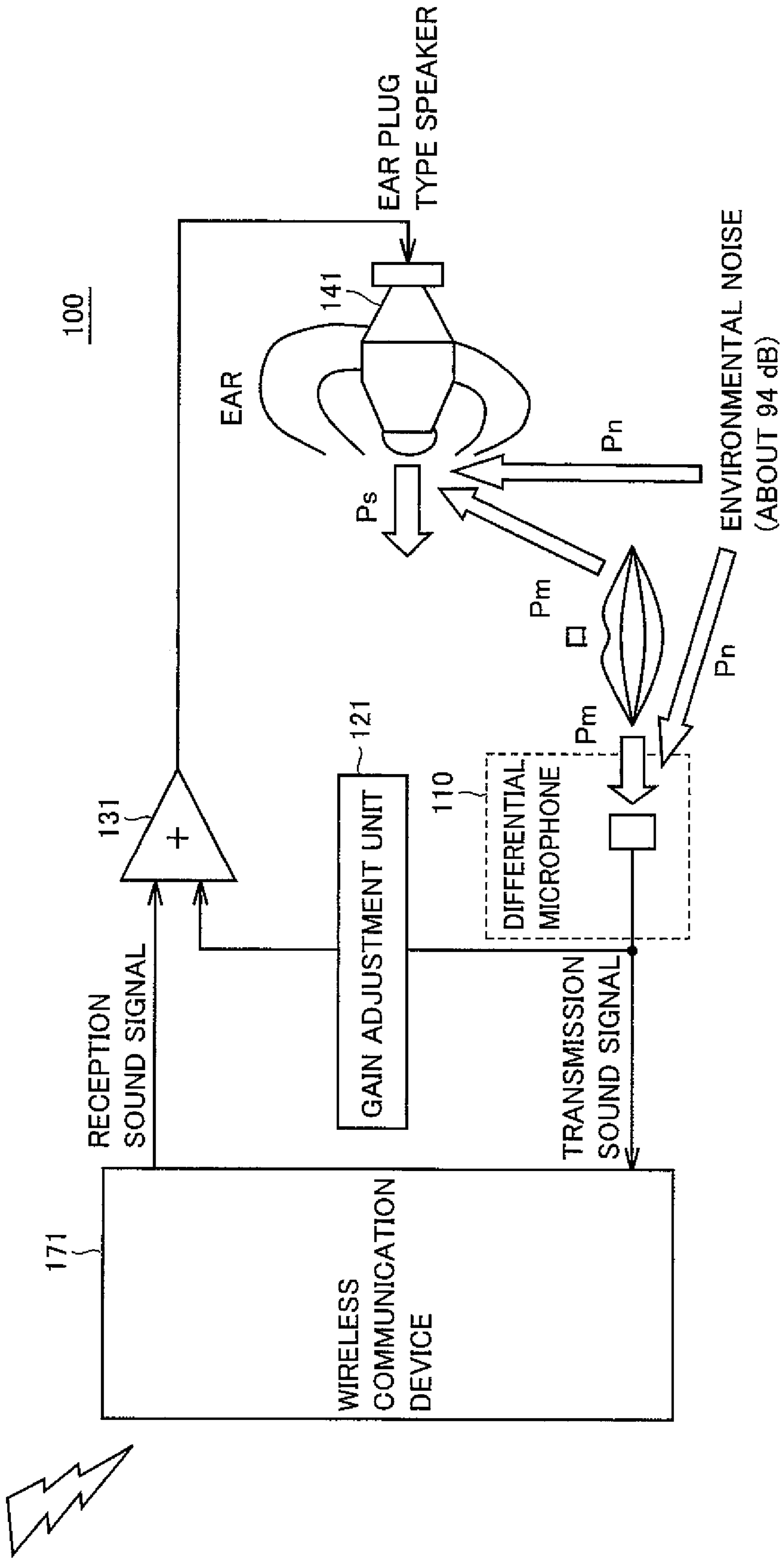
FIG. 1 is a schematic diagram showing an entire configuration of a sound signal transmitter-receiver according to an embodiment of the present invention.

Preferred embodiments of the present invention will be described below with reference to the drawings. In the following description, like components are designated by like reference numerals, and the components have the same names and like functions. The detailed description thereof is thus not given.

First Embodiment

Entire Configuration of Sound Signal Transmitter-Receiver

FIG. 1 is a schematic diagram showing an entire configuration of a sound signal transmitter-receiver 100 according to an embodiment of the present invention. Referring to FIG. 1, the entire configuration of sound signal transmitter-receiver 100 according to the present invention will be described below. Typically, sound signal transmitter-receiver 100 is implemented by a cellular phone capable of performing wireless communication or a personal computer capable of placing an IP (Internet Protocol) telephone.

Sound signal transmitter-receiver 100 includes a differential microphone 110, a gain adjustment unit 121, an adder 131, an earplug type speaker (such as an earphone and a sound-isolating headphone) 141, and a wireless communication device 171. In sound signal transmitter-receiver 100 according to the present embodiment, differential microphone 110 receives a speech voice Pm of a talker of sound signal transmitter-receiver 100 and an environmental noise (background noise) Pn. At this point, ears of the talker receive speech voice Pm of the talker, environmental noise (background noise) Pn, and a received voice Ps from earplug type speaker 141.

(Functional Configuration of Sound Signal Transmitter-Receiver 100)

Figure 2:
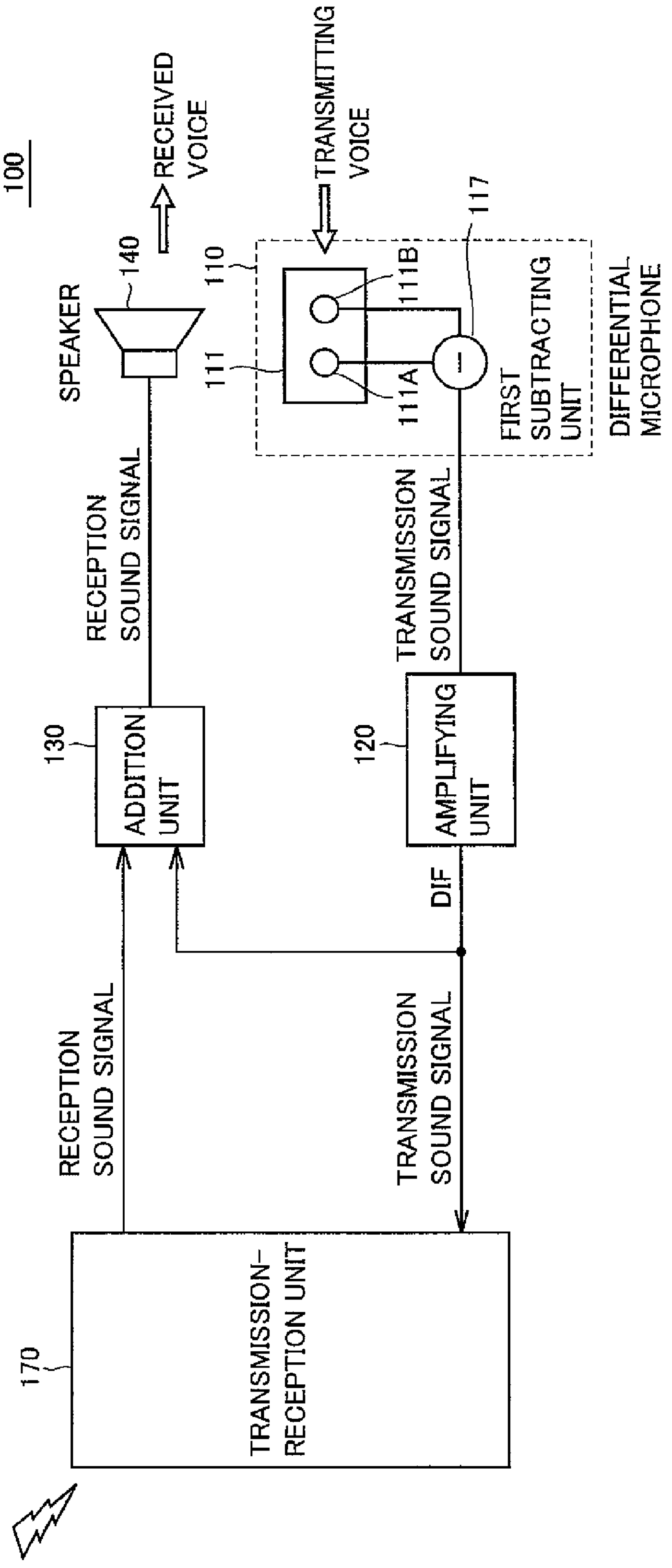
FIG. 2 is a block diagram showing a functional configuration of the sound signal transmitter-receiver of a first embodiment.

FIG. 2 is a block diagram showing a functional configuration of sound signal transmitter-receiver 100 according to the present embodiment. Referring to FIG. 2, sound signal transmitter-receiver 100 according to the present embodiment includes differential microphone 110, an amplifying unit 120, an addition unit 130, a sound-isolating speaker 140, and a transmission-reception unit 170. In sound signal transmitter-receiver 100 according to the present embodiment, each of the functional blocks is realized by dedicated hardware circuits such as differential microphone 110, gain adjustment unit 121, adder 131, earplug type speaker 141, and wireless communication device 171. Gain adjustment unit 121 is used to adjust a mixing level in adder 131 and is not necessarily required.

It should be noted that sound signal transmitter-receiver 100 may be a cellular phone or a personal computer that includes a CPU (Central Processing Unit) and a memory device, and that the functional blocks described below may be implemented as part of the functions possessed by CPU. That is, a control program for achieving the following functions may be stored in the memory device, and CPU may read the control program from the memory device to execute the control program, thereby implementing the following functional blocks.

Figure 3A:
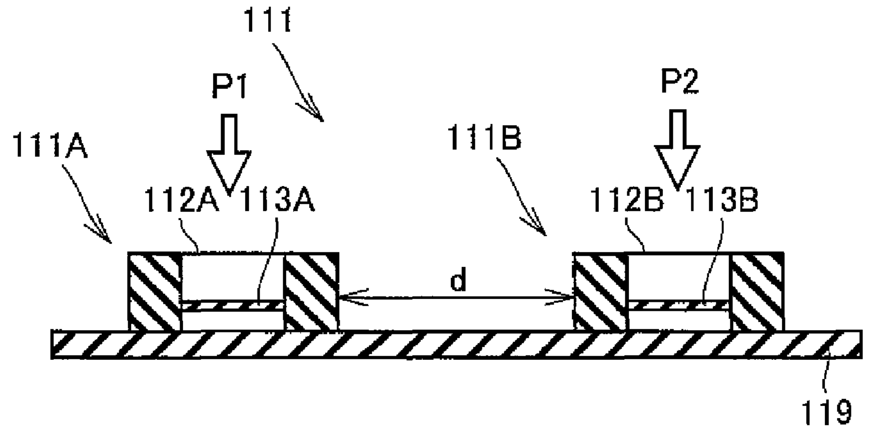
FIG. 3A is a cross-sectional side view showing a configuration of a differential microphone which electrically obtains a difference in transmitting voice.
Figure 3B:
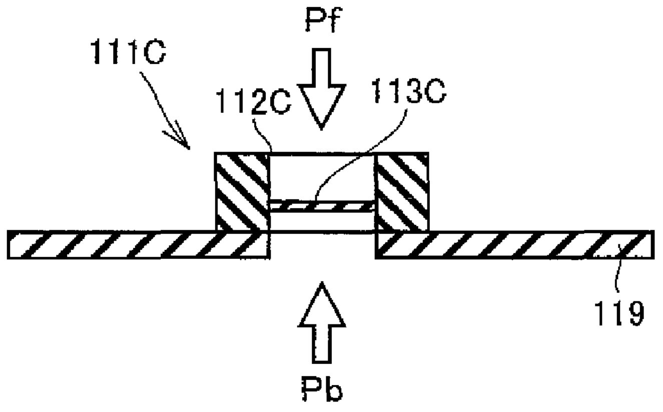
FIG. 3B is a cross-sectional side view showing a configuration of a differential microphone which acoustically obtains a difference in transmitting voice.

The functions will be described below. FIGS. 3A and 3B are cross-sectional side views showing configurations of two types of differential microphones 110. FIG. 3A shows one of the types formed by a plurality of microphones, and FIG. 3B shows the other type formed by a single microphone. That is, FIG. 3A illustrates a system which obtains an electrical difference in transmitting voice (receiving sound), and FIG. 3B illustrates a system which obtains an acoustic difference in transmitting voice.

Referring to FIGS. 2 and 3A, in the case where differential microphone 110 is formed by the plurality of microphones, differential microphone 110 includes a receiving unit 111 and a first subtracting unit 117. Receiving unit 111 includes a first microphone 111A, a second microphone 111B, and a board 119, and first microphone 111A and a second microphone 111B are away from each other by a predetermined distance d.

First microphone 111A includes a vibrating membrane 113A. Vibrating membrane 113A is vibrated by sound pressure reaching first microphone 111A and produces a first electric signal according to the vibration. That is, first microphone 111A receives a transmitting voice at a first position to convert the transmitting voice into the first electric signal and supplies the first electric signal to first subtracting unit 117.

Second microphone 111B includes a vibrating membrane 113B. Vibrating membrane 113B is vibrated by sound pressure reaching second microphone 111B and produces a second electric signal according to the vibration. That is, second microphone 111B receives the transmitting voice at a second position to convert the transmitting voice into the second electric signal and supplies the second electric signal to first subtracting unit 117.

First microphone 111A and second microphone 111B are connected to first subtracting unit 117. First subtracting unit 117 produces a differential signal between the first electric signal and the second electric signal as a transmission sound signal, based on the first electric signal fed from first microphone 111A and the second electric signal fed from second microphone 111B. That is, in this system, differential microphone 110 performs acousto-electric conversion of obtained sound pressures P1 and P2 to obtain voltages v1 and v2 and obtains a voltage difference (v1−v2) corresponding to a sound pressure difference based on voltages v1 and v2 using first subtracting unit 117.

(Noise Removal Principle of Differential Microphone 110)

Figure 4:
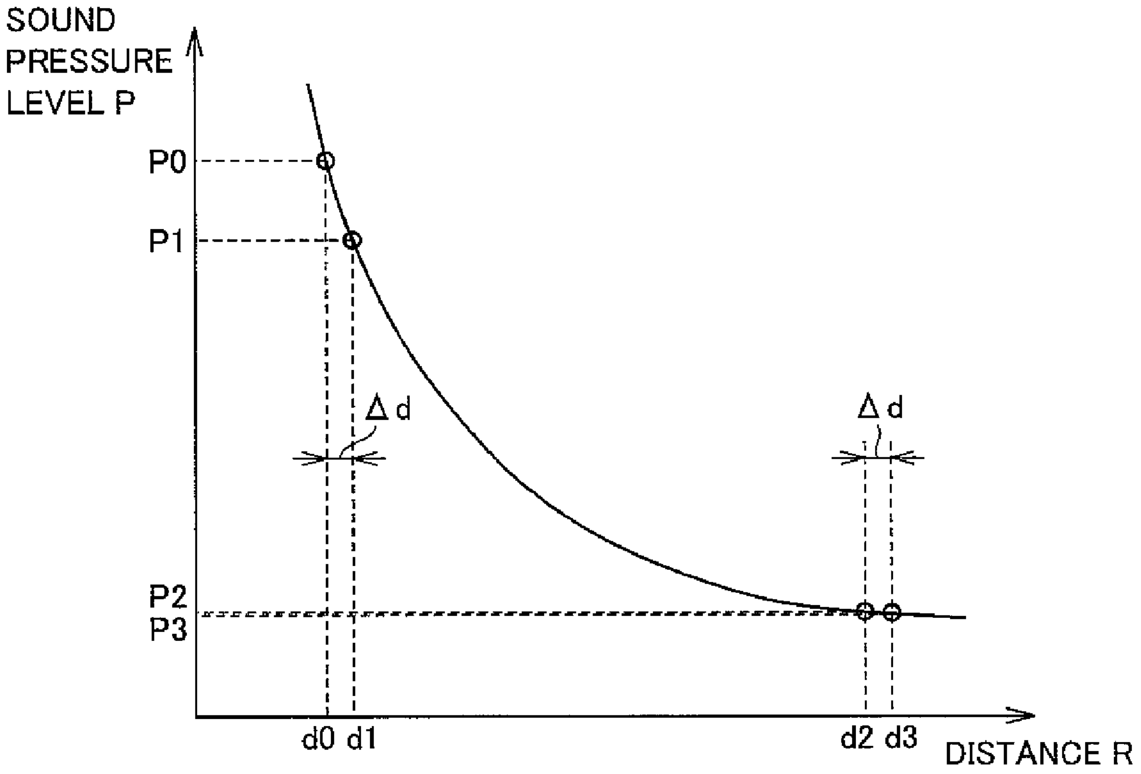
FIG. 4 is a graph showing a relationship between a sound pressure P and a distance R from a sound source.

A property of the acoustic wave will be described. FIG. 4 is a graph showing a relationship between a sound pressure P and a distance R from a sound source. As shown in FIG. 4, while traveling in a medium such as air, the acoustic wave is attenuated, so that the sound pressure (the intensity and amplitude of the acoustic wave) is lowered. Because the sound pressure is inversely proportional to the distance from the sound source, sound pressure P can be expressed by an equation (1) in the relationship with the distance R from the sound source.

$$P=k/R \quad (1)$$

where k is a proportional constant.

As is clear from FIG. 4 and the equation (1), the sound pressure (the amplitude of the acoustic wave) is rapidly attenuated at a position (the left side of the graph) closer to the sound source and is gently attenuated as the sound pressure is distant from the sound source. That is, the sound pressures transmitted to two positions (d0 and d1, and d2 and d3) that are different from each other in distance from the sound source only by Δd are largely attenuated (P0−P1) from d0 to d1 located closer to the sound source, while being not attenuated so much (P2−P3) from d2 to d3 located far away from the sound source.

When differential microphone 110 according to the present embodiment is applied to sound signal transmitter-receiver 100 typified by the cellular phone, the speech voice of the talker is generated near differential microphone 110. Therefore, the voice of the talker is largely attenuated between first microphone 111A and second microphone 111B, and a large difference in sound pressure of the received speech voice of the talker appears between first microphone 111A and second microphone 111B.

On the other hand, in the background noise, the sound source is present far away from differential microphone 110 compared with the speech voice of the talker. Therefore, the sound pressure of the background noise is not substantially attenuated between first microphone 111A and second microphone 111B, and little difference in sound pressure of the received speech voice of the talker appears between first microphone 111A and second microphone 111B.

A noise removal principle in differential microphone 110 according to the present embodiment will be described below. As described above, because of the little difference in sound pressure of the background noise between first microphone 111A and second microphone 111B, a noise signal corresponding to the background noises produced at first microphone 111A and second microphone 111B is substantially cancelled by first subtracting unit 117. On the other hand, because of the large difference in sound pressure of the received speech voice of the talker between first microphone 111A and second microphone 111B, a signal corresponding to the speech voices produced at first microphone 111A and second microphone 111B is not cancelled by first subtracting unit 117. That is, first subtracting unit 117 mainly supplies as the transmission sound signals speech sound signals that are of the speech voices produced at first microphone 111A and second microphone 111B.

Thus, it can be considered that differential microphone 110 mainly supplies the speech sound signal corresponding to the speech voice of the talker. That is, the electric signal (the transmission sound signal) supplied from differential microphone 110 can be considered to be a signal that indicates the speech voice of the talker with the noise reduced. According to differential microphone 110 according to the present embodiment, the sound signal transmitter-receiver capable of obtaining the electric signal that indicates the speech voice of the talker with the noise reduced can be provided with a simple configuration. With differential microphone 110 according to the present embodiment, the sound from the sound source located far away from the mouth of the talker, even if it is an unsteady noise, can efficiently be reduced.

(Modification of Differential Microphone)

A modification of differential microphone 110 will be described below. Referring to FIG. 3B, differential microphone 110 includes a third microphone 111C and aboard 119. Third microphone 111C includes a vibrating membrane 113C. Vibrating membrane 113C is vibrated by sound pressures Pf and Pb reaching third microphone 111C in two directions and produces a third electric signal according to the vibration. That is, third microphone 111C receives the transmitting voices transmitted in the two directions to convert the transmitting voices into the third electric signal.

In differential microphone 110 according to the present modification, vibrating membrane 113C receives sound pressures Pf and Pb from above and below, and vibrating membrane 113C is vibrated according to a sound pressure difference (Pf−Pb). Therefore, when the sound pressures having the same magnitude are simultaneously applied to both sides of vibrating membrane 113C, the two sound pressures cancel each other at vibrating membrane 113C, and vibrating membrane 113 is not vibrated. On the contrary, when different sound pressures are applied to both the sides of vibrating membrane 113C, vibrating membrane 113C is vibrated by the sound pressure difference.

The acoustic wave transmitted to an upper surface of vibrating membrane 113C differs from the acoustic wave that is transmitted to a lower surface of vibrating membrane 113C round board 119 in transmission distance. As described above, the sound pressure (the amplitude of the acoustic wave) is rapidly attenuated at a position (the left side of the graph of FIG. 4) closer to the sound source and is gently attenuated at a position farther from the sound source (the right side of the graph of FIG. 4). Therefore, for the acoustic wave to the speech voice of the talker, there is a large difference between sound pressure Pf transmitted to the upper surface of vibrating membrane 113C and sound pressure Pb that is transmitted to the lower surface of vibrating membrane 113C round board 119. On the other hand, for the acoustic wave to the surrounding background noise, there is a very small difference between sound pressure Pf transmitted to the upper surface of vibrating membrane 113C and sound pressure Pb that is transmitted to the lower surface of vibrating membrane 113C round board 119.

Since the difference between sound pressures Pf and Pb of the background noise received by vibrating membrane 113C is very small, the sound pressure to the background noise is substantially cancelled at vibrating membrane 113. On the other hand, since the difference between sound pressures Pf and Pb of the speech voice of the talker received by vibrating membrane 113C is large, the sound pressure to the speech voice is not cancelled at vibrating membrane 113. Thus, third microphone 111C (differential microphone 110) supplies as the transmission sound signal a third signal obtained through vibration of vibrating membrane 113C. That is, in this system, the voltage difference (v1−v2) is obtained by the acousto-electric conversion of the sound pressure difference (Pf−Pb).

It can be considered that differential microphone 110 mainly supplies the signal corresponding to the speech voice of the talker. That is, the electric signal supplied from differential microphone 110 is considered to be the signal that indicates only the speech voice of the talker with the noise removed. With differential microphone 110 according the present modification, sound signal transmitter-receiver 100 capable of obtaining the electric signal that indicates the speech voice of the talker with the noise removed can be provided with a simple configuration. With differential microphone 110 according to the present modification, the sound from the sound source located far away from the mouth of the talker can, even if it is an unsteady noise, efficiently be reduced.

(Functional Configuration of Sound Signal Transmitter-Receiver 100)

Referring to FIG. 2, amplifying unit 120 is implemented by an amplifying circuit in which an operational amplifier or the like is used, and is connected to differential microphone 110, addition unit 130, and transmission-reception unit 170. Amplifying unit 120 amplifies the transmission sound signal fed from differential microphone 110 and supplies the transmission sound signal to transmission-reception unit 170 and addition unit 130.

Transmission-reception unit 170 is implemented by wireless communication device 171 such as an antenna (not shown) and is connected to amplifying unit 120 and addition unit 130. Transmission-reception unit 170 transmits the transmission sound signal while receiving the reception sound signal. More particularly, transmission-reception unit 170 transmits the transmission sound signal fed from amplifying unit 120 to the outside and receives the reception sound signal from the outside to supply the reception sound signal to addition unit 130.

Addition unit 130 is connected to transmission-reception unit 170, amplifying unit 120, and sound-isolating speaker 140. Addition unit 130 adds the reception sound signal fed from transmission-reception unit 170 and the transmission sound signal fed from amplifying unit 120 to produce an added signal to supply the added signal to sound-isolating speaker 140.

Sound-isolating speaker 140 is implemented by earplug type speaker 141 or a sound-isolating headphone and converts the added signal fed from addition unit 130 into a received voice to supply the received voice. Because the ears of the talker are closed by sound-isolating speaker 140, it is difficult that the background noise (environmental noise Pn) directly enters the ears of the talker. More particularly, the talker can wear the earphone or the sound-isolating headphone to lower speech voice Pm and the background noise (environmental noise Pn) directly entering the ears by about 20 dB.

Figure 5:
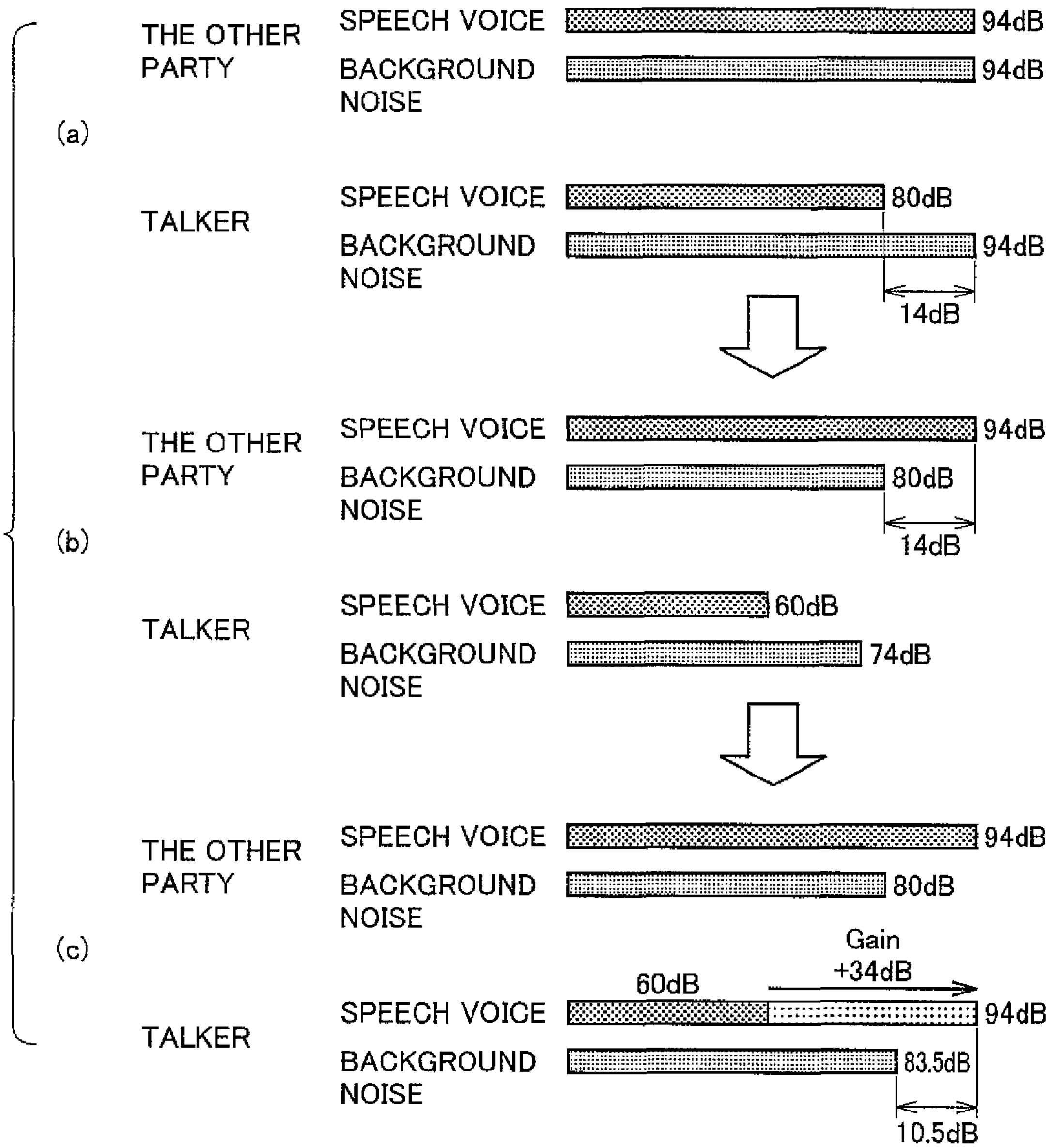
FIG. 5 illustrates sound pressures of voices caught by a talker and the other party.

A part (a) of FIG. 5 illustrates sound pressures of voices caught by a talker and the other party when a conventional sound signal transmitter-receiver is used, a part (b) of FIG. 5 illustrates sound pressures of voices caught by a talker and the other party when differential microphone 110 and sound-isolating speaker 140 are used, and a part (c) of FIG. 5 illustrates sound pressures of voices caught by a talker and the other party when sound signal transmitter-receiver 100 according to the present embodiment is used.

It is assumed that the speech voice fed into the microphone of the sound signal transmitter-receiver is equal to the background noise in the magnitude of the sound pressure (94 dB). When the conventional sound signal transmitter-receiver is used as shown in the part (a) of FIG. 5, the speech voice (94 dB) of the talker amplified by the amplifying unit and the background noise (94 dB) are combined in the voice caught by the other party. The incoming speech voice (80 dB) from the mouth of the talker and the background noise (94 dB) are combined in the sound pressure of the voice caught by the talker. The reason why the incoming speech voice from the mouth of the talker is set to 80 dB is that the distance from the mouth of the talker to the ears of the talker is larger than the distance from the mouth of the talker to the microphone of the sound signal transmitter-receiver and the attenuation rate of the sound pressure of a speech voice having a small distance from the sound source becomes larger than the attenuation rate of the sound pressure of a background noise having a small distance from the sound source. In this case, the talker speaks up because the talker hardly catches the speech voice of him/herself. As a result, the other party hears the raised voice from the talker, and the other party possibly may feel uncomfortable.

Because sound signal transmitter-receiver 100 according to the present embodiment includes differential microphone 110, the background noise can be reduced. Therefore, as shown in the part (b) of FIG. 5, the speech voice (94 dB) of the talker amplified by amplifying unit 120 and the background noise (80 dB) are combined in the voice caught by the other party. Since sound signal transmitter-receiver 100 includes sound-isolating speaker 140 such as an earphone and a sound-isolating headphone, the speech voice caught by the talker and the background noise can be reduced. Sound-isolating speaker 140 reduces the sound pressure of the voice caught by the talker by about 20 dB, and the voice caught by the talker becomes the speech voice of 60 dB and the background noise of 74 dB.

In addition, as shown in the part (c) of FIG. 5, sound signal transmitter-receiver 100 according to the present embodiment amplifies the electric signal corresponding to the speech voice (94 dB) and the background noise (80 dB) which are the transmission sound signal supplied from differential microphone 110 and adds the amplified signal to the reception sound signal. Sound-isolating speaker 140 supplies the added signal as the received voice. At this point, when the amplification rate is set such that the speech voice caught by the talker becomes 94 dB, the voice caught by the talker becomes the speech voice of 94 dB and the background noise of 83.5 dB.

Thus, with sound signal transmitter-receiver 100 according to the present embodiment, in an environment where the speech voice is at an equal level to the background noise, both the other party and the talker can clearly catch the talker-side transmitting voice because the background noise level is suppressed lower than that of the speech voice level by 10 dB or more.

Second Embodiment

Figure 6:
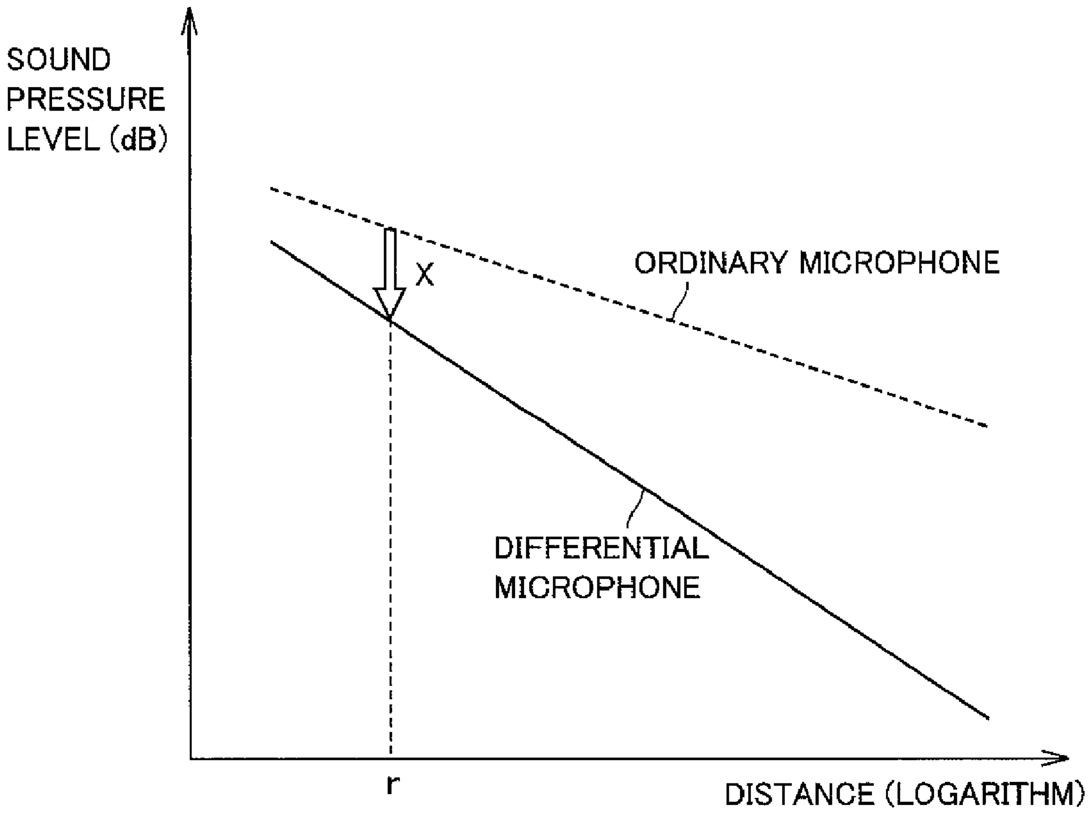
FIG. 6 is a graph showing a relationship between a logarithmically converted distance R from the sound source and a logarithmically converted sound pressure P supplied from a microphone.

FIG. 6 is a graph showing a relationship between a logarithmically converted distance R from the sound source and a logarithmically converted sound pressure P supplied from a microphone (dB: decibel). A dotted line indicates a characteristic of an ordinary microphone and a solid line indicates a characteristic of the differential microphone.

As shown in FIG. 6, the sound pressure level (dB) that is detected and supplied by differential microphone 110 exhibits a characteristic that is largely decreased with increasing distance from the sound source compared with the ordinary microphone; however, as the difference in sound pressure between two different points is taken out as an output signal, the output level is lower by X than that of the ordinary microphone at a distance r that is usually assumed between the talker and the microphone.

Accordingly, in order to obtain a transmission sound signal at an equal level to the ordinary microphone, it is necessary that the gain of amplifying unit 120 be increased more than that of the ordinary microphone. The increased amount of the gain depends on the interval between the microphones. For example, when the interval between the microphones is set at about 5 mm, it is necessary to increase the gain by about 15 dB.

On the other hand, assuming that the ordinary microphone is equal to the differential microphone in noise level of a first-stage preamplifier used in the microphone, the differential microphone is at disadvantage in SNR (Signal to Noise Ratio) compared with the ordinary microphone. For example, For example, when the interval between the microphones is set about 5 mm, the differential microphone is at disadvantage of about 15 dB. That is, when the gain of the differential microphone is increased to obtain a transmission sound signal at an equal level to the ordinary microphone, the differential microphone is at disadvantage of the increased amount of the gain.

Therefore, in a silent environment (an environment with small background noise), the noise of the first-stage preamplifier of the microphone becomes a nonnegligible level with respect to the signal level of the background noise supplied from differential microphone 110, and the amplifier noise may be caught (easily recognized) by the other party or the talker. That is, the use of differential microphone 110 lowers the SNR of sound signal transmitter-receiver 100, whereby the amplifier noise may be caught by the other party or the talker.

Sound signal transmitter-receivers 100 according to the present embodiment and third to seventh embodiments have a configuration for solving the problem. Specifically, sound signal transmitter-receiver 100 according to the present embodiment produces a reception sound signal using not the sound signal from differential microphone 110 but the sound signal from a first microphone 111A when sound signal transmitter-receiver 100 according to the present embodiment is placed in a condition where background noise is small.

Because the entire configuration of sound signal transmitter-receiver 100 according to the present embodiment is similar to that of the above-described first embodiment, the detailed description is not repeated. Since the configuration of differential microphone 110 constituting sound signal transmitter-receiver 100 and the principle of noise removal performed by differential microphone 110 are similar to those of the first embodiment, the detailed description is not repeated.

In sound signal transmitter-receiver 100 according to the first embodiment, differential microphone 110 may have a configuration in which an electric difference is detected as shown in FIG. 3A or may have a configuration in which an acoustic difference is detected as shown in FIG. 3B. On the other hand, it is assumed that differential microphones 110 of sound signal transmitter-receivers 100 according to the second to seventh embodiments to be described below have a configuration in which an electric difference is detected as shown in FIG. 3A.

(Functional Configuration of Sound Signal Transmitter-Receiver 100)

Figure 7:
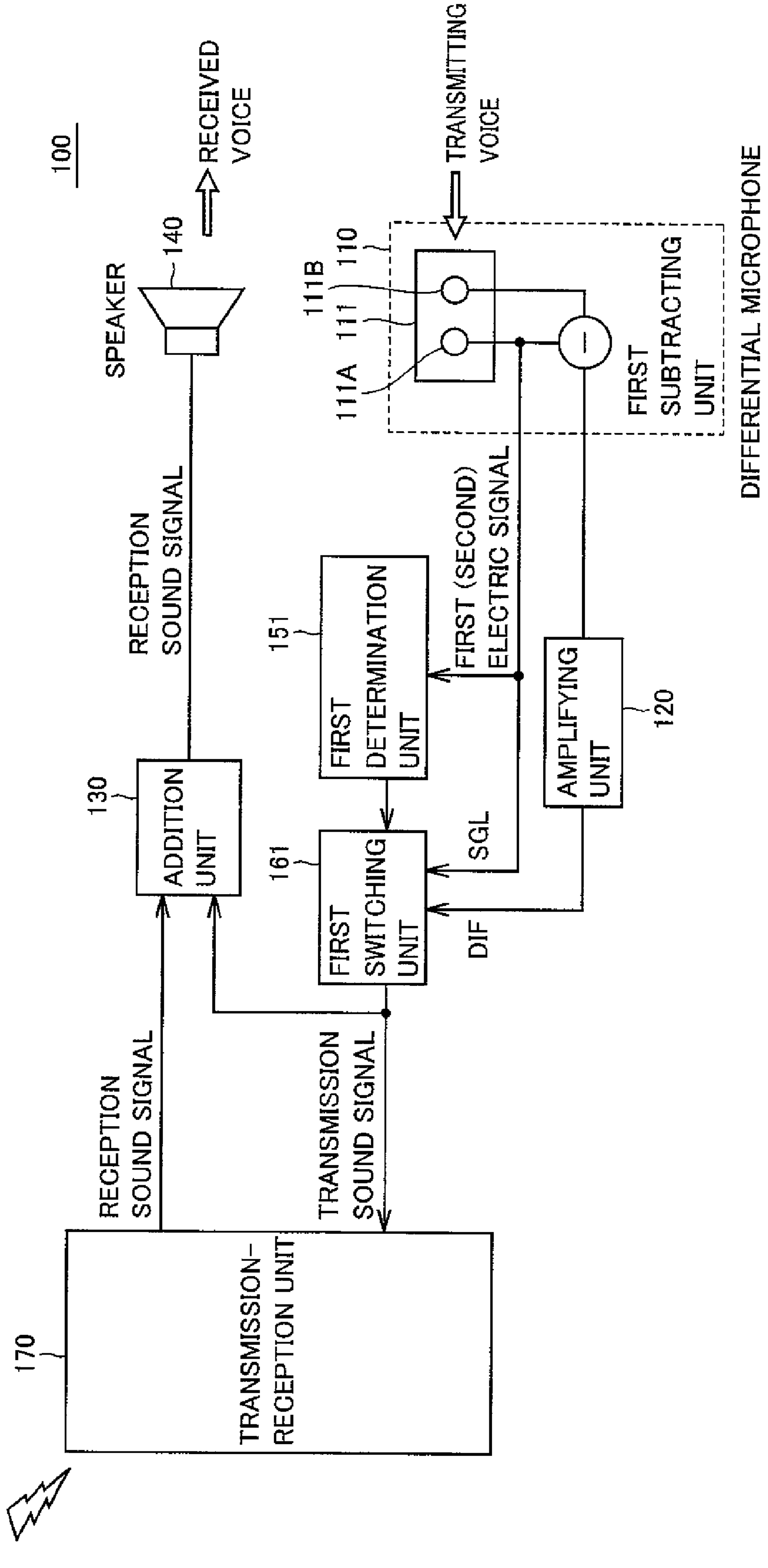
FIG. 7 is a block diagram showing a functional configuration of a sound signal transmitter-receiver according to a second embodiment.

FIG. 7 is a block diagram showing a functional configuration of sound signal transmitter-receiver 100 according to the present embodiment. Referring to FIG. 7, sound signal transmitter-receiver 100 according to the present embodiment includes differential microphone 110, amplifying unit 120, addition unit 130, sound-isolating speaker 140, a first determination unit 151, a first switching unit 161, and transmission-reception unit 170. In sound signal transmitter-receiver 100 according to the present embodiment also, each of the functional blocks is realized by a dedicated hardware circuit and the like.

It should be noted that sound signal transmitter-receiver 100 may be a cellular phone or a personal computer that includes a CPU (Central Processing Unit) and a memory device, and that the functional blocks described below may also be implemented as part of the functions possessed by the CPU. That is, a control program for achieving the following functions may be stored in the memory device, and the CPU may read the control program from the memory device to execute the control program, thereby implementing the following functional blocks.

Each function will be described below. Because differential microphone 110, amplifying unit 120, addition unit 130, sound-isolating speaker 140, and transmission-reception unit 170 according to the present embodiment are similar to those of the first embodiment, the detailed description is not repeated.

As shown in FIG. 7, first determination unit 151 is connected to first microphone 111A and first switching unit 161. First determination unit 151 determines whether or not the amplitude of the first electric signal from first microphone 111A is larger than a predetermined threshold, and supplies the determination result to first switching unit 161. At this point, the predetermined threshold may be stored in first determination unit 151. Alternatively, first determination unit 151 may read the threshold stored in another memory device or the like to compare the threshold with the amplitude of the first electric signal.

First switching unit 161 is connected to first microphone 111A or second microphone 111B, amplifying unit 120, first determination unit 151, and addition unit 130. Based on the determination result of first determination unit 151, first switching unit 161 feeds the transmission sound signal from amplifying unit 120 into addition unit 130 when the amplitude of the first electric signal is not lower than the predetermined threshold, whereas first switching unit 161 feeds the first electric signal or the second electric signal into addition unit 130 when the amplitude of the first electric signal is lower than the predetermined threshold.

That is, first switching unit 161 switches between the differential voice obtained by differential microphone 110 and the single signal obtained by microphone 111A (or 111B) according to the magnitude of the sound pressure of the voice obtained by first microphone 111A to supply it to addition unit 130.

Similarly, based on the determination result of first determination unit 151, first switching unit 161 supplies the transmission sound signal from amplifying unit 120 to transmission-reception unit 170 when the amplitude of the first electric signal is not lower than the predetermined threshold, whereas first switching unit 161 supplies the first electric signal or the second electric signal to transmission-reception unit 170 when the amplitude of the first electric signal is lower than the predetermined threshold.

Thus, in an environment where background noise is small, sound signal transmitter-receiver 100 according to the present embodiment is configured such that the SNR shall not be lowered, by producing the reception sound signal and the transmission sound signal using one microphone 111A (111B). Accordingly, such a configuration is provided that noise generated in the amplifying circuit is not caught by the talker or the other party even in an environment where background noise is small.

In the present embodiment, first determination unit 151 makes determination based on the amplitude of the first electric signal from first microphone 111A. However, the present invention is not limited to the amplitude of the first electric signal, and any parameter, such as the power of the first electric signal, may be used as long as the parameter is changed according to the signal level.

Amplifying unit 120 may be formed inside differential microphone 110. Amplifying unit 120 is not necessarily required, and amplifying unit 120 may be formed as part of first subtracting unit 117.

Third Embodiment

A sound signal transmitter-receiver 100 according to a third embodiment also produces a reception sound signal using not the sound signal from differential microphone 110 but the sound signal from one of microphones 111A and 111B when sound signal transmitter-receiver 100 is placed in a condition where background noise is small.

Because the entire configuration of sound signal transmitter-receiver 100 according to the present embodiment is similar to that of the above-described first embodiment, the detailed description thereof is not repeated. Since the configuration of differential microphone 110 constituting sound signal transmitter-receiver 100 and the principle of noise removal performed by differential microphone 110 are similar to those of the first embodiment, the detailed description is not repeated.

(Functional Configuration of Sound Signal Transmitter-Receiver 100)

Figure 8:
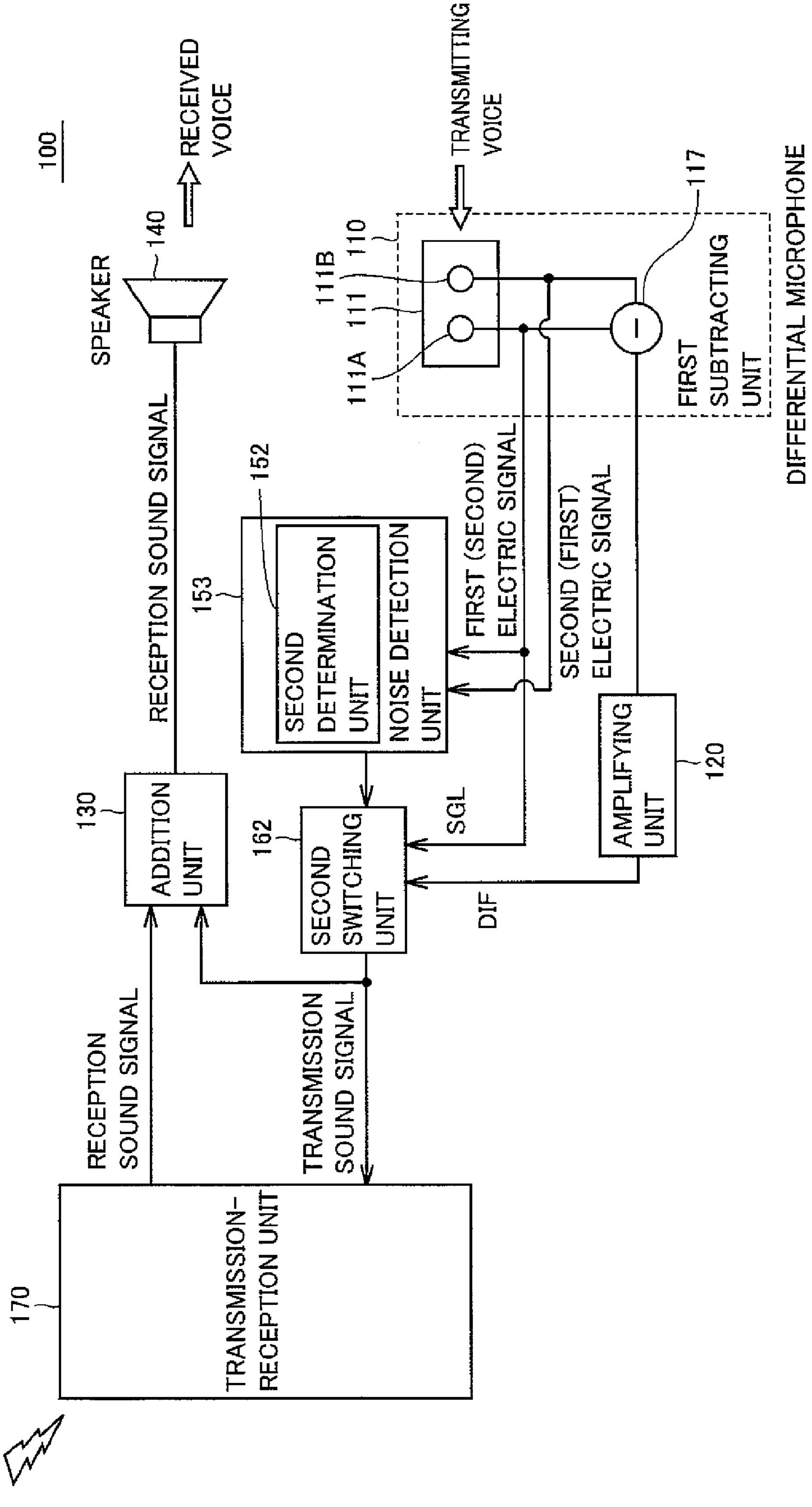
FIG. 8 is a block diagram showing a functional configuration of a sound signal transmitter-receiver according to a third embodiment.

FIG. 8 is a block diagram showing a functional configuration of sound signal transmitter-receiver 100 according to the present embodiment. Referring to FIG. 8, sound signal transmitter-receiver 100 according to the present embodiment includes differential microphone 110, amplifying unit 120, addition unit 130, sound-isolating speaker 140, a noise detection unit 153, second switching unit 161, and transmission-reception unit 170. Also in sound signal transmitter-receiver 100 according to the present embodiment, each of the functional blocks described below is realized by a dedicated hardware circuit and the like.

It should be noted that sound signal transmitter-receiver 100 may be a cellular phone or a personal computer that includes a CPU (Central Processing Unit) and a memory device, and that the functional blocks described below may be implemented as part of the functions possessed by the CPU. That is, a control program for achieving the following functions may be stored in the memory device, and the CPU may read the control program from the memory device to execute the control program, thereby implementing the following functional blocks.

Each function will be described below. Because differential microphone 110, amplifying unit 120, addition unit 130, sound-isolating speaker 140, and transmission-reception unit 170 according to the present embodiment are similar to those of the first embodiment, the detailed description is not repeated.

Noise detection unit 153 is connected to first microphone 111A, second microphone 111B, and first switching unit 161. Noise detection unit 153 extracts a noise signal based on the first electric signal from first microphone 111A and the second electric signal from second microphone 111B and determines whether or not the amplitude of the noise signal is larger than a predetermined threshold to supply the determination result to second switching unit 162.

Figure 9:
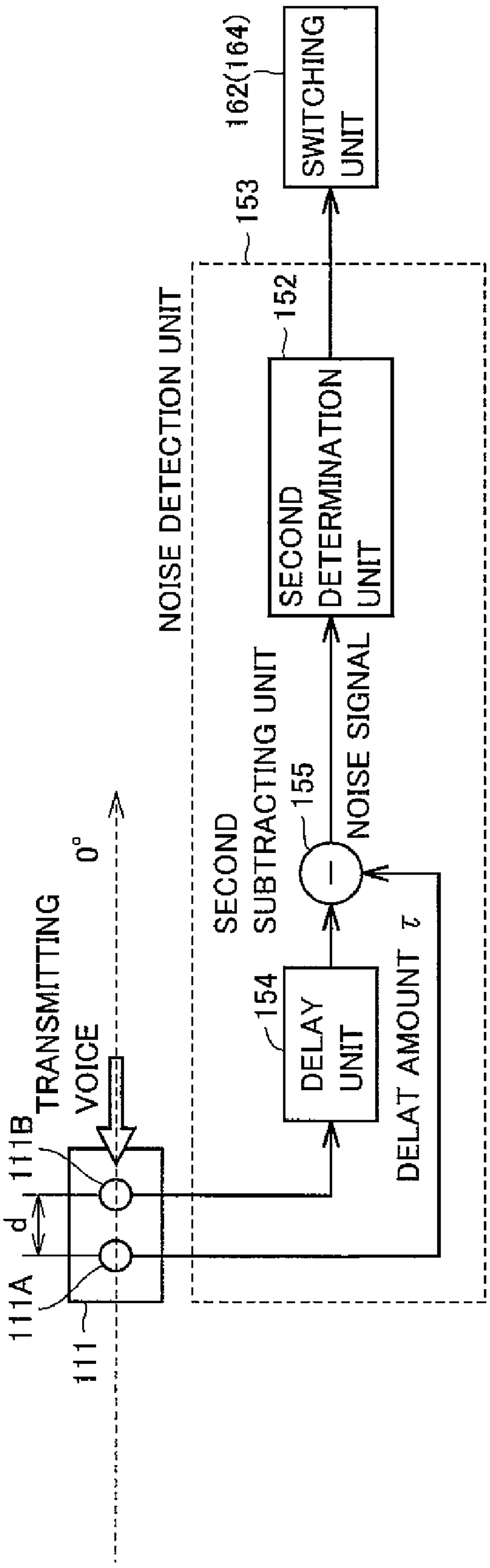
FIG. 9 is a functional block diagram showing a functional configuration of a noise detection unit.

FIG. 9 is a functional block diagram showing a functional configuration of noise detection unit 153. Referring to FIG. 9, noise detection unit 153 includes a delay unit 154, a second subtracting unit 155, and a second determination unit 152. An ordinary differential microphone exhibits a bi-directivity characteristic. However, delay unit 154 gives a proper delay amount to second microphone 111B such that the directivity characteristic becomes a cardioid type.

Figure 10A:
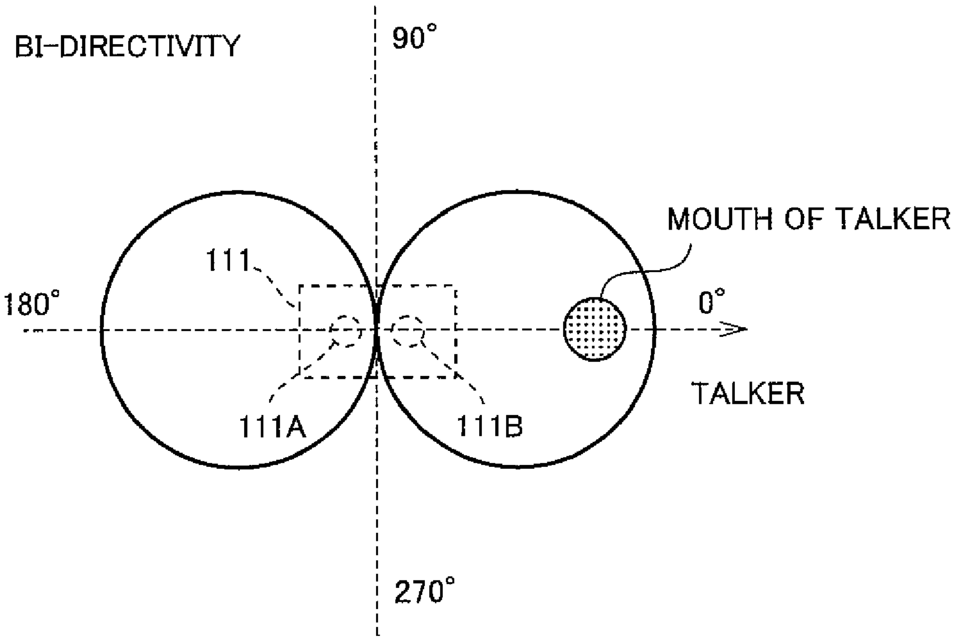
FIG. 10A illustrates a directivity characteristic of a microphone having a delay amount $\tau=0$.
Figure 10B:
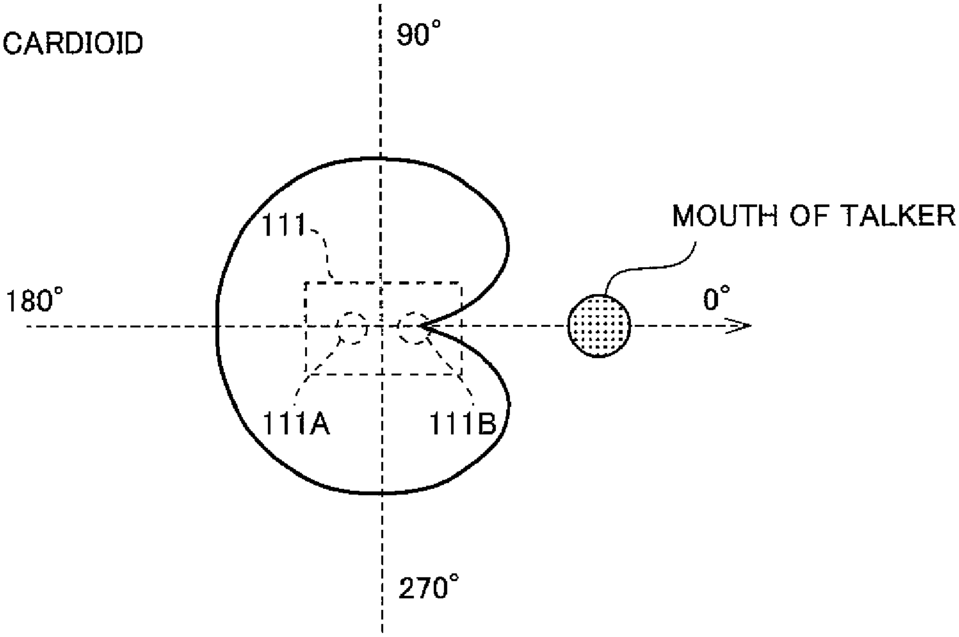
FIG. 10B illustrates a directivity characteristic of a microphone having a delay amount $\tau=d/c$.

FIGS. 10A and 10B show the directivity characteristic of the microphone when a delay amount of delay unit 154 is changed. When the delay amount of delay unit 154 is zero, the bi-directivity characteristic is exhibited as shown in FIG. 10A, and sensitivity is obtained on both sides with receiving unit 111 interposed therebetween.

When the delay amount of delay unit 154 is changed, the directivity characteristic of the microphone is also changed, and a null direction is changed. When the delay amount is a predetermined time $\tau$ (equation 1), the directivity characteristic of the microphone becomes the cardioid type as shown in FIG. 10B.

In order to achieve the cardioid characteristic of FIG. 10B, the predetermined time $\tau$ according to the present embodiment is set as follows:

$$\tau = d/c \qquad \text{(equation 1)}$$

where d is a distance between first microphone 111A and second microphone 111B and c is a propagation speed of the acoustic wave.

Delay unit 154 supplies an output of second microphone 111B to second subtracting unit 155 while the output of second microphone 111B is delayed by the predetermined time τ, the second microphone 111B being the microphone located closer to the talker side (incoming transmitting voice side).

Second subtracting unit 155 is connected to first microphone 111A, delay unit 154, and second determination unit 152. Second subtracting unit 155 produces a differential signal between the first electric signal and the output of delay unit 154 and supplies the differential signal as the noise signal to second determination unit 152.

As shown in FIGS. 9 and 10B, noise detection unit 153 has the cardioid characteristic with null in the directivity at a zero degrees direction (side of second microphone 111B on a straight line connecting first microphone 111A and second microphone 111B). Therefore, when receiving unit 111 is located such that the mouth of the talker (for example, the microphone of the cellular phone) is located in this direction, the voice in the talker direction is cut to selectively extract the voice generated in directions other than the talker direction.

Second determination unit 152 is connected to second subtracting unit 155 and second switching unit 162. Second determination unit 152 determines whether or not the amplitude of the noise signal from second subtracting unit 155 is larger than a predetermined threshold and supplies the determination result to switching unit 162. At this point, the predetermined threshold may be stored in second determination unit 152. Alternatively, second determination unit 152 may read the threshold stored in another memory device or the like to compare the threshold with the amplitude of the noise signal.

Referring to FIG. 8, second switching unit 162 is connected to first microphone 111A or second microphone 111B, amplifying unit 120, noise detection unit 153 (second determination unit 152), and addition unit 130. Based on the determination of noise detection unit 153 (second determination unit 152), second switching unit 162 feeds the transmission sound signal from amplifying unit 120 to addition unit 130 when the amplitude of the noise signal is not lower than the predetermined threshold, whereas second switching unit 162 feeds the first electric signal or the second electric signal to addition unit 130 when the amplitude of the noise signal is lower than the predetermined threshold.

That is, depending on the magnitude of the sound pressure of the background noise, second switching unit 162 switches a differential sound signal (DIF) obtained by differential microphone 110 and a single signal (SGL) obtained by one microphone 111A (111B) and supplies the switched signal to addition unit 130.

Similarly, based on the determination result of noise detection unit 153 (second determination unit 152), second switching unit 162 supplies the transmission sound signal from amplifying unit 120 to transmission-reception unit 170 when the amplitude of the noise signal is not lower than the predetermined threshold, whereas second switching unit 162 supplies the first electric signal or the second electric signal to transmission-reception unit 170 when the amplitude of the noise signal is lower than the predetermined threshold.

Thus, in an environment where background noise is small, sound signal transmitter-receiver 100 according to the present embodiment is configured such that the SNR shall not be lowered, by producing the reception sound signal and the transmission sound signal using one microphone 111A (111B). Accordingly, such a configuration is provided that the noise of the amplifying circuit and the like are hardly caught by the talker or the other party even in an environment where background noise is small.

In the present embodiment, the gain of amplifying unit 120 is preferably set such that the level of the talker sound signal (DIF) obtained by differential microphone 110 is substantially equal to the level of the talker sound signal (SGL) obtained by one microphone 111A (111B). Therefore, when second switching unit 162 switches the signals, a fluctuation in the level of the talker sound signal can be prevented, whereby a telephone call with natural feeling can be made.

Second determination unit 152 makes determination based on the amplitude of the noise signal. However, the present invention is not limited to the amplitude of the noise signal, and any parameter such as the power of the noise signal may be used as long as the parameter is changed according to the noise signal level.

Amplifying unit 120 may be formed inside differential microphone 110. Amplifying unit 120 is not necessarily required, and amplifying unit 120 may be formed as part of first subtracting unit 117.

Fourth Embodiment

In the second and third embodiments, a configuration in which the reception sound signal and the transmission sound signal are produced using not the sound signal from differential microphone 110 but the sound signal from one microphone 111A (111B) in a condition where background noise is small. A sound signal transmitter-receiver 100 according to a fourth embodiment accepts a switching command from the talker to produce the reception sound signal and the transmission sound signal using not the sound signal from differential microphone 110 but the sound signal from one microphone 111A.

Because the entire configuration of sound signal transmitter-receiver 100 according to the present embodiment is similar to that of the above-described first embodiment, the detailed description thereof is not repeated. Since the configuration of differential microphone 110 constituting sound signal transmitter-receiver 100 and the principle of noise removal performed by differential microphone 110 are similar to those of the first embodiment, the detailed description is not repeated.

(Functional Configuration of Sound Signal Transmitter-Receiver 100)

Figure 11:
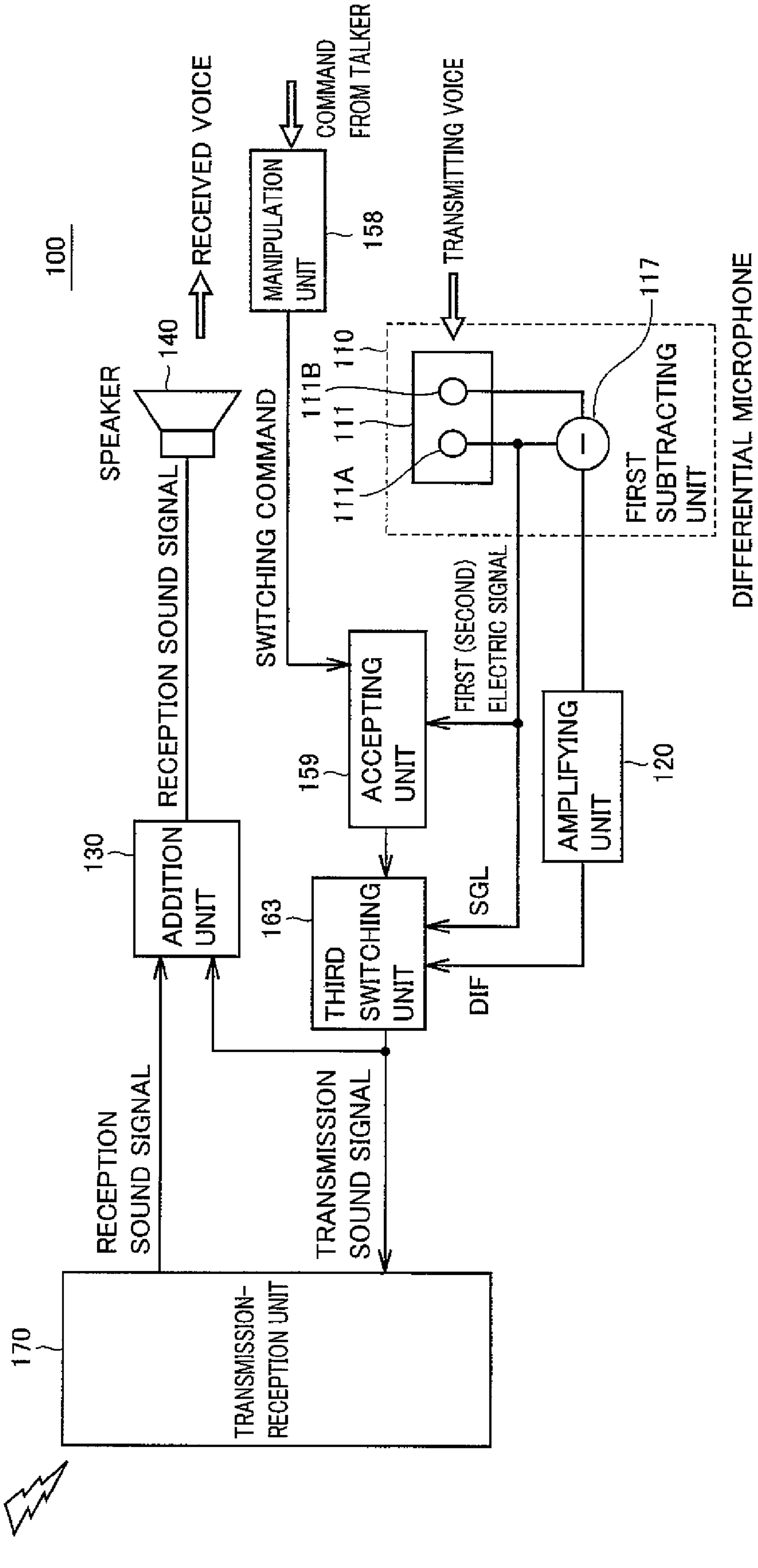
FIG. 11 is a block diagram showing a functional configuration of a sound signal transmitter-receiver according to a fourth embodiment.

FIG. 11 is a block diagram showing a functional configuration of a sound signal transmitter-receiver 100 according to the present embodiment. Referring to FIG. 11, sound signal transmitter-receiver 100 according to the present embodiment includes differential microphone 110, amplifying unit 120, addition unit 130, sound-isolating speaker 140, a manipulation unit 158, an accepting unit 159, a third switching unit 163, and transmission-reception unit 170. Also in sound signal transmitter-receiver 100 according to the present embodiment, each of the functional blocks described below is realized by a dedicated hardware circuit and the like.

It should be noted that sound signal transmitter-receiver 100 may be a cellular phone or a personal computer that includes a CPU (Central Processing Unit) and a memory device, and that the functional blocks described below may be implemented as part of the functions possessed by the CPU. That is, a control program for achieving the following functions may be stored in the memory device, and the CPU may read the control program from the memory device to execute the control program, thereby implementing the following functional blocks.

Each function will be described below. Because differential microphone 110, amplifying unit 120, addition unit 130, sound-isolating speaker 140, and transmission-reception unit 170 according to the present embodiment are similar to those of the first embodiment, the detailed description is not repeated. As shown in FIG. 11, manipulation unit 158 is implemented, for example, by a manipulation button in a cellular phone or a keyboard or a mouse of a personal computer for accepting a switching command from the talker.

Accepting unit 159 is connected to manipulation unit 158 and third switching unit 163. Accepting unit 159 accepts a switching command from the outside through manipulation unit 158 and supplies the switching command to third switching unit 163.

Third switching unit 163 is connected to first microphone 111A or second microphone 111B, amplifying unit 120, accepting unit 159, and addition unit 130. Third switching unit 163 switches between the transmission sound signal from amplifying unit 120 and the first electric signal from first microphone 111A or the second electric signal from second microphone 111B in response to the switching command, and supplies the switched signal to addition unit 130. That is, third switching unit 163 switches the differential voice obtained by differential microphone 110 and the single signal obtained by one microphone 111A (111B) according to the manipulation of the talker and supplies the switched signal to addition unit 130.

Similarly, third switching unit 163 switches the transmission sound signal from amplifying unit 12 and the first electric signal from first microphone 111A or the second electric signal from second microphone 111B in response to the switching command, and supplies the switched signal to transmission-reception unit 170.

Thus, in an environment where background noise is small, that is, in the case where the noise of the amplifying circuit is caught by the talker or the other party, sound signal transmitter-receiver 100 according to the present embodiment is configured such that the talker has the reception sound signal and the transmission sound signal produced by using one microphone 111A (111B) so as not to lower the SNR. Accordingly, it becomes possible that the noise of the amplifying circuit is not caught by the talker or the other party even in an environment with small background noise.

In the present embodiment, the gain of amplifying unit 120 is preferably set such that the level of the talker sound signal (DIF) obtained by differential microphone 110 is substantially equal to the level of the talker sound signal (SGL) obtained by one microphone 111A (111B). Therefore, when third switching unit 163 switches the signals, fluctuation in level of the talker sound signal can be prevented, whereby a telephone call with natural feeling can be made.

Amplifying unit 120 may be formed inside differential microphone 110. Amplifying unit 120 is not necessarily required, and amplifying unit 120 may be formed as part of first subtracting unit 117.

Fifth Embodiment

When sound signal transmitter-receiver 100 according to a fifth embodiment is placed in a condition where background noise is small, the reception sound signal is fed into sound-isolating speaker 140 without adding the sound signal from the differential microphone 110 to the reception sound signal.

Because the entire configuration of sound signal transmitter-receiver 100 according to the present embodiment is similar to that of the above-described first embodiment, the detailed description thereof is not repeated. Since the configuration of differential microphone 110 constituting sound signal transmitter-receiver 100 and the principle of noise removal performed by differential microphone 110 are similar to those of the first embodiment, the detailed description is not repeated.

(Functional Configuration of Sound Signal Transmitter-Receiver 100)

Figure 12:
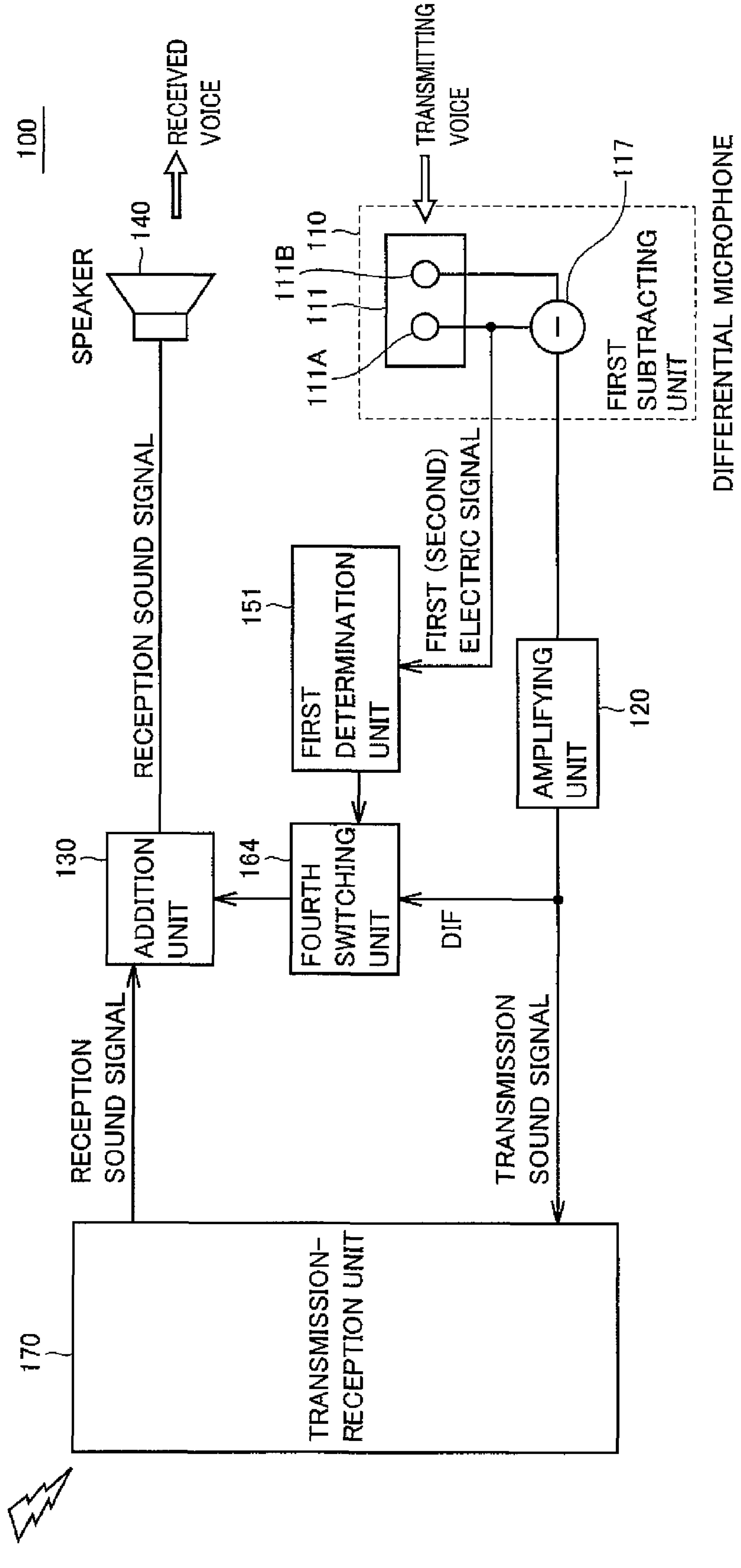
FIG. 12 is a block diagram showing a functional configuration of a sound signal transmitter-receiver according to a fifth embodiment.

FIG. 12 is a block diagram showing a functional configuration of a sound signal transmitter-receiver 100 according to the present embodiment. Referring to FIG. 12, sound signal transmitter-receiver 100 according to the present embodiment includes differential microphone 110, amplifying unit 120, addition unit 130, sound-isolating speaker 140, first determination unit 151, a fourth switching unit 164, and transmission-reception unit 170. Also in sound signal transmitter-receiver 100 according to the present embodiment, each of the functional blocks is realized by a dedicated hardware circuit and the like.

It should be noted that sound signal transmitter-receiver 100 may be a cellular phone or a personal computer that includes a CPU (Central Processing Unit) and a memory device, and that the functional blocks described below may be implemented as part of the functions possessed by the CPU. That is, a control program for achieving the following functions may be stored in the memory device, and the CPU may read the control program from the memory device to execute the control program, thereby implementing the following functional blocks.

Each function will be described below. Because differential microphone 110, amplifying unit 120, addition unit 130, sound-isolating speaker 140, first determination unit 151, and transmission-reception unit 170 according to the present embodiment are similar to those of the second embodiments, the detailed description is not repeated.

As shown in FIG. 12, fourth switching unit 164 is connected to amplifying unit 120, first determination unit 151, and addition unit 130. Based on the determination result of first determination unit 151, fourth switching unit 164 connects amplifying unit 120 and addition unit 130, that is, the transmission sound signal from amplifying unit 120 is fed into addition unit 130 when the amplitude of the first electric signal is not lower than a predetermined threshold, whereas fourth switching unit 164 does not connect amplifying unit 120 with addition unit 130, that is, the transmission sound signal from amplifying unit 120 is not fed into addition unit 130 when the amplitude of the first electric signal is lower than the predetermined threshold.

Thus, in an environment where background noise is small, sound signal transmitter-receiver 100 according to the present embodiment is configured such that the SNR shall not be lowered, by producing the reception sound signal without using differential microphone 110. Accordingly, such a configuration is provided that the noise generated in the amplifying circuit is not caught by the talker even in an environment where background noise is small.

In the present embodiment, amplifying unit 120 and transmission-reception unit 170 are connected to each other. Alternatively, fourth switching unit 164 and transmission-reception unit 170 may be connected to each other. As in the second embodiment, based on the determination result of first determination unit 151, fourth switching unit 164 supplies the transmission sound signal from amplifying unit 120 to transmission-reception unit 170 when the amplitude of the first electric signal is not lower than the predetermined threshold, whereas fourth switching unit 164 supplies the first electric signal or the second electric signal to transmission-reception unit 170 when the amplitude of the first electric signal is lower than the predetermined threshold.

Therefore, in an environment where background noise is small, sound signal transmitter-receiver 100 according to the present embodiment is configured such that the SNR shall not be lowered, by producing the transmission sound signal using one microphone 111A (111B). Accordingly, such a configuration is provided that the noise generated in the amplifying circuit is not caught by the other party even in an environment where background noise is small.

In the present embodiment, amplifying unit 120 is not necessarily required. Amplifying unit 120 may be formed inside differential microphone 110, or amplifying unit 120 may be formed as part of first subtracting unit 117.

Sixth Embodiment

When sound signal transmitter-receiver 100 according to a sixth embodiment is placed in a condition where background noise is small, the reception sound signal is also fed into sound-isolating speaker 140 without adding the sound signal from differential microphone 110 to the reception sound signal.

Because the entire configuration of sound signal transmitter-receiver 100 according to the present embodiment is similar to that of the first embodiment, the detailed description thereof is not repeated. The configuration of differential microphone 110 constituting sound signal transmitter-receiver 100 and the principle of noise removal performed by differential microphone 110 are similar to those of the first embodiment, the detailed description is not repeated.

(Functional Configuration of Sound Signal Transmitter-Receiver 100)

Figure 13:
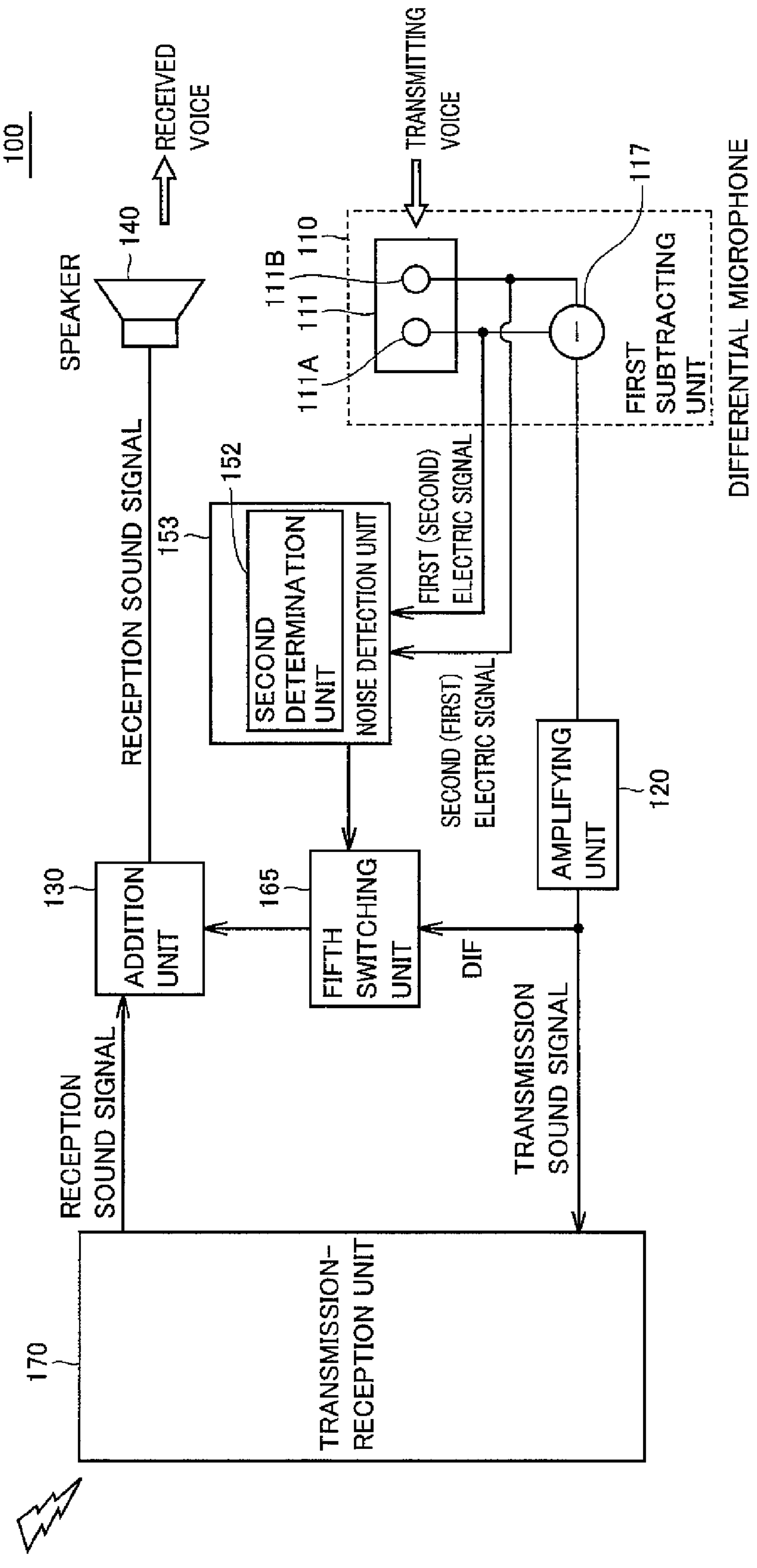
FIG. 13 is a block diagram showing a functional configuration of a sound signal transmitter-receiver according to a sixth embodiment.

FIG. 13 is a block diagram showing a functional configuration of sound signal transmitter-receiver 100 according to the present embodiment. Referring to FIG. 13, sound signal transmitter-receiver 100 according to the present embodiment includes differential microphone 110, amplifying unit 120, addition unit 130, sound-isolating speaker 140, noise detection unit 153, a fifth switching unit 165, and transmission-reception unit 170. Also in sound signal transmitter-receiver 100 according to the present embodiment, each of the functional blocks described below is realized by a dedicated hardware circuit and the like.

It should be noted that sound signal transmitter-receiver 100 may be a cellular phone or a personal computer that includes a CPU (Central Processing Unit) and a memory device, and that the functional blocks described below may be implemented as part of the functions possessed by the CPU. That is, a control program for achieving the following functions may be stored in the memory device, and the CPU may read the control program from the memory device to execute the control program, thereby implementing the following functional blocks.

Each function will be described below. Because differential microphone 110, amplifying unit 120, addition unit 130, sound-isolating speaker 140, noise detection unit 153, and transmission-reception unit 170 according to the present embodiment are similar to those of the third embodiment, the detailed description is not repeated.

Fifth switching unit 165 is connected to amplifying unit 120, noise detection unit 153, and addition unit 130. Based on the determination result of noise detection unit 153 (second determination unit 152), fifth switching unit 165 connects amplifying unit 120 with addition unit 130, that is, the transmission sound signal from the amplifying unit 120 is fed into addition unit 130 when the amplitude of the noise signal is not lower than a predetermined threshold, whereas fifth switching unit 165 does not connect amplifying unit 120 with addition unit 130, that is, the transmission sound signal from amplifying unit 120 is not fed into addition unit 130 when the amplitude of the noise signal is lower than the predetermined threshold.

Thus, in an environment where background noise is small, sound signal transmitter-receiver 100 according to the present embodiment is configured such that the SNR shall not be lowered, by producing the reception sound signal without using differential microphone 110. Accordingly, such a configuration is provided that the noise generated in the amplifying circuit is not caught by the talker even in an environment where background noise is small.

In the present embodiment, amplifying unit 120 and transmission-reception unit 170 are connected to each other. Alternatively, fifth switching unit 165 and transmission-reception unit 170 may be connected to each other. As in the third embodiment, based on the determination result of noise detection unit 153 (second determination unit 152), fifth switching unit 165 supplies the transmission sound signal from amplifying unit 120 to transmission-reception unit 170 when the amplitude of the noise signal is not lower than a predetermined threshold, whereas fifth switching unit 165 supplies the first electric signal or the second electric signal to transmission-reception unit 170 when the amplitude of the noise signal is lower than the predetermined threshold.

Therefore, in an environment where background noise is small, sound signal transmitter-receiver 100 according to the present embodiment is configured such that the SNR shall not be lowered, by producing the transmission sound signal using one microphone 111A (111B). Accordingly, such a configuration is provided that the noise generated in the amplifying circuit is not caught by the other party even in an environment where background noise is small.

In the present embodiment, amplifying unit 120 is not necessarily required. Amplifying unit 120 may be formed inside differential microphone 110, or amplifying unit 120 may be formed as part of first subtracting unit 117.

Seventh Embodiment

Exemplified in the fifth and sixth embodiments is the configuration in which the reception sound signal is fed into sound-isolating speaker 140 without adding the sound signal from the differential microphone 110 to the reception sound signal in a condition where background noise is small. In a sound signal transmitter-receiver 100 according to a seventh embodiment, a switching command is accepted from the talker, and the reception sound signal is fed into sound-isolating speaker 140 while the sound signal from differential microphone 110 is not added to the reception sound signal.

Because the entire configuration of sound signal transmitter-receiver 100 according to the present embodiment is similar to that of the above-described first embodiment, the detailed description thereof is not repeated. The configuration of differential microphone 110 constituting sound signal transmitter-receiver 100 and the principle of noise removal performed by differential microphone 110 are similar to those of the first embodiment, the detailed description is not repeated.

(Functional Configuration of Sound Signal Transmitter-Receiver 100)

Figure 14:
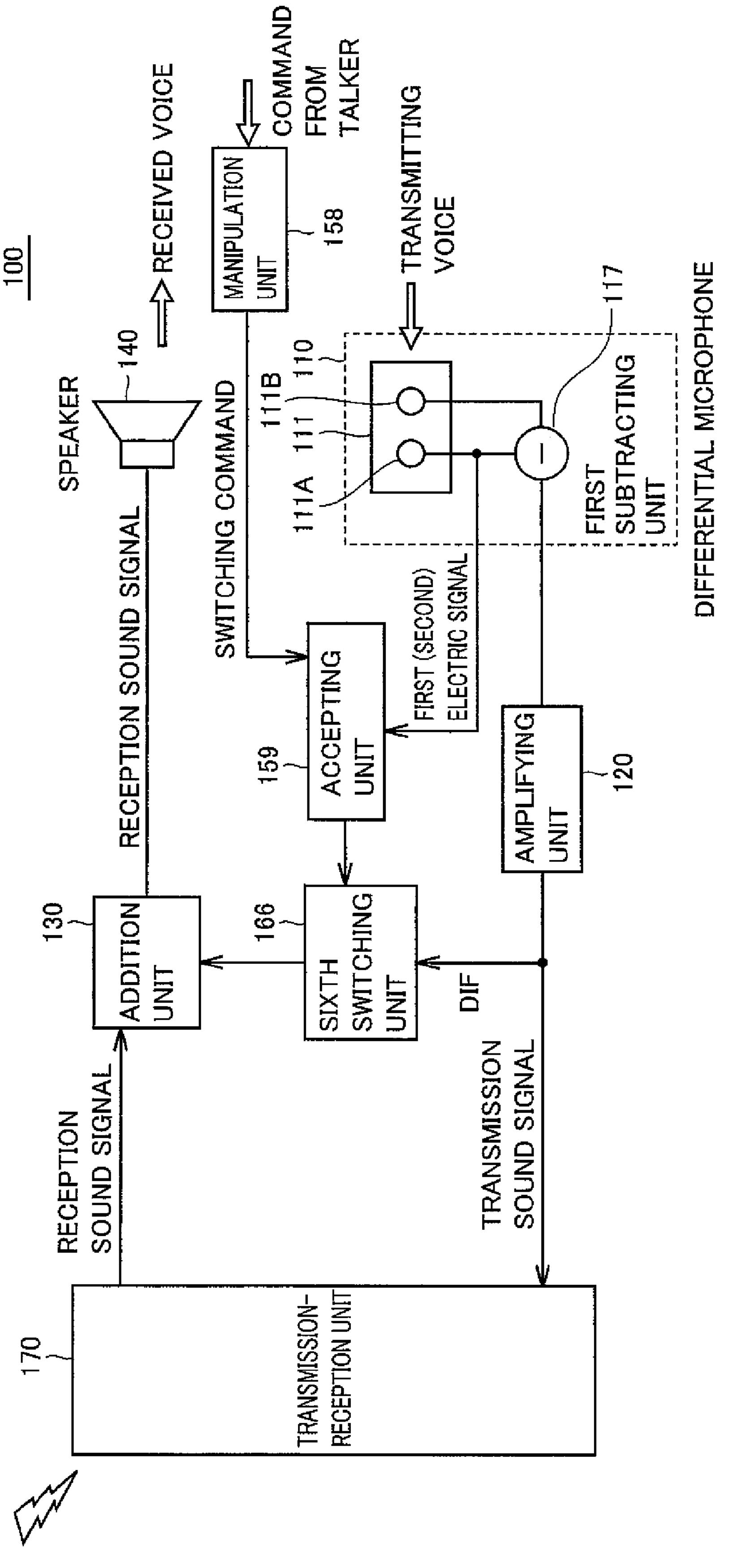
FIG. 14 is a block diagram showing a functional configuration of a sound signal transmitter-receiver according to a seventh embodiment.

FIG. 14 is a block diagram showing a functional configuration of sound signal transmitter-receiver 100 according to the present embodiment. Referring to FIG. 14, sound signal transmitter-receiver 100 according to the present embodiment includes differential microphone 110, amplifying unit 120, addition unit 130, sound-isolating speaker 140, manipulation unit 158, accepting unit 159, a sixth switching unit 166, and transmission-reception unit 170. Also in sound signal transmitter-receiver 100 according to the present embodiment, each of the functional blocks described below is realized by a dedicated hardware circuit and the like.

It should be noted that sound signal transmitter-receiver 100 may be a cellular phone or a personal computer that includes a CPU (Central Processing Unit) and a memory device, and that the functional blocks described below may be implemented as part of the functions possessed by the CPU. That is, a control program for achieving the following functions may be stored in the memory device, and the CPU may read the control program from the memory device to execute the control program, thereby implementing the following functional blocks.

Each function will be described below. Because differential microphone 110, amplifying unit 120, addition unit 130, sound-isolating speaker 140, manipulation unit 158, accepting unit 159, and transmission-reception unit 170 according to the present embodiment are similar to those of the fourth embodiment, the detailed description is not repeated.

As shown in FIG. 14, sixth switching unit 166 is connected to amplifying unit 120, accepting unit 159, and addition unit 130. Sixth switching unit 163 changes the connection between amplifying unit 120 and addition unit 130 in response to a switching command. That is, sixth switching unit 163 connects amplifying unit 120 with addition unit 130 or disconnects the connection in response to the switching command.

Thus, in an environment where background noise is small, that is, in the case where the noise of the amplifying circuit is caught by the talker or the other party, sound signal transmitter-receiver 100 according to the present embodiment is configured such that the SNR shall not be lowered, by producing the reception sound signal according to the command of the talker without using differential microphone 110. Accordingly, such a configuration is provided that the noise and the like generated in the amplifying circuit is not caught by the talker even in an environment where background noise is small.

In the present embodiment, the output of amplifying unit 120 and transmission-reception unit 170 are connected to each other. Alternatively, the output of sixth switching unit 166 and transmission-reception unit 170 may be connected to each other. As in the fourth embodiment, in response to the switching command from accepting unit 159, sixth switching unit 166 may supply the transmission sound signal from amplifying unit 120 to transmission-reception unit 170 or may supply the first electric signal or the second electric signal to transmission-reception unit 170.

In the present embodiment, amplifying unit 120 is not necessarily required. Amplifying unit 120 may be formed inside differential microphone 110, or amplifying unit 120 may be formed as part of first subtracting unit 117.

In the first to seventh embodiments, the type of the sound signal fed into addition unit 130 is switched, or the transmission sound signal is not fed into addition unit 130; however, the function of differential microphone 110 itself may be disabled, that is, differential microphone 110 may be changed to a microphone having the same function as an ordinary microphone. That is, a path (hole) of the acoustic wave for one of sound pressure P1 and sound pressure P2 of FIG. 3A may be closed, or a path (hole) of the acoustic wave for one of sound pressure Pf and sound pressure Pb of FIG. 3B may be closed, thereby disabling the function of differential microphone 110.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A sound signal transmitter-receiver comprising:

a differential microphone configured to receive sounds second points to convert said receiving sounds at a first point and a second point, to detect an acoustic or electric difference between the sounds received at each of the first point and the second point, and to output a differential sound signal;

a transmission-reception unit, separate from the differential microphone and forming part of a wireless communication device, configured to receive a wireless incoming signal and to output a received sound signal representative of the wireless incoming signal, and further configured to transmit a wireless transmitted signal representative of the differential sound signal;

an addition unit arranged to add the received sound signal from the transmission-reception unit and said transmission the differential sound signal from the differential microphone to produce an addition signal; and a speaker configured to output sound based on the addition signal.

2. The sound signal transmitter-receiver according to claim 1, wherein the differential microphone includes:

a first microphone converting the sound received at the first point into a first electric signal;

a second microphone converting the sound received at the second point into a second electric signal; and a signal production unit for producing the differential sound signal from a difference between the first electric signal and the second electric signal.

3. The sound signal transmitter-receiver according to claim 1, wherein the speaker is an earphone or a sound-isolating headphone.

4. The sound signal transmitter-receiver according to claim 1, wherein the sound signal transmitter-receiver is a cellular phone.

5. The sound signal transmitter-receiver according to claim 1, wherein the differential microphone is positioned near a mouth of a user to receive sounds.

6. The sound signal transmitter-receiver according to claim 1, wherein the speaker of the sound signal transmitter-receiver is positioned near an ear of a user.

7. A sound signal transmitter-receiver comprising:

a differential microphone for receiving sounds respectively at first and second points to convert the receiving sounds into a transmission sound signal by detecting acoustic or electric difference between the receiving sounds;

a transmission-reception unit for receiving an incoming signal as a reception sound signal and transmitting the transmission sound signal, wherein the transmission-reception unit is part of a wireless communication device;

an addition unit configured to add the reception sound signal from the transmission-reception unit and the transmission sound signal to produce an addition signal;

a speaker configured to output sound based on the addition signal;

a noise detection unit for determining whether or not an amplitude or power of a noise signal is larger than a predetermined threshold by extracting the noise signal based on the first electric signal and the second electric signal; and a second switching unit for switching a signal fed into the addition unit based on a determination result, wherein the second switching unit feeds the transmission sound signal into the addition unit when the amplitude or power of the noise signal is larger than a predetermined threshold, and the second switching unit feeds one of the first electric signal and the second electric signal into the addition unit when the amplitude or power of the noise signal is not larger than the predetermined threshold.

8. A sound signal transmitter-receiver comprising:

a differential microphone for receiving sounds respectively at first and second points to convert the receiving sounds into a transmission sound signal by detecting an acoustic or electric difference between the receiving sounds;

a transmission-reception unit for receiving an incoming signal as a reception sound signal and transmitting the transmission sound signal, wherein the transmission-reception unit is part of a wireless communication device;

an addition unit configured to add the reception sound signal from the transmission-reception unit and the transmission sound signal to produce an addition signal;

a speaker configured to output sound based on the addition signal;

a noise detection unit for determining whether or not an amplitude or power of a noise signal is larger than a predetermined threshold by extracting the noise signal based on the first electric signal and the second electric signal; and a second switching unit for switching a signal fed into the addition unit based on a determination result, wherein the second switching unit feeds the transmission sound signal into the addition unit when the amplitude or power of the noise signal is larger than a predetermined threshold, and the second switching unit feeds one of the first electric signal and the second electric signal into the addition unit when the amplitude or power of the noise signal is not larger than the predetermined threshold, wherein the noise detection unit has a cardioid characteristic.

9. A sound signal transmitter-receiver comprising, a differential microphone for receiving sounds respectively at first and second points to convert the receiving sounds into a transmission sound signal by detecting an acoustic or electric difference between the receiving sounds;

a transmission-reception unit for receiving an incoming signal as a reception sound signal and transmitting the transmission sound signal, wherein the transmission-reception unit is part of a wireless communication device;

an addition unit configured to add the reception sound signal from the transmission-reception unit and the transmission sound signal to produce an addition signal;

a speaker configured to output sound based on the addition signal;

a noise detection unit for determining whether or not an amplitude or power of a noise signal is larger than a predetermined threshold by extracting the noise signal based on the first electric signal and the second electric signal; and a second switching unit for switching a signal fed into the addition unit based on a determination result, wherein the second switching unit feeds the transmission sound signal into the addition unit when the amplitude or power of the noise signal is larger than a predetermined threshold, and the second switching unit feeds one of the first electric signal and the second electric signal into the addition unit when the amplitude or power of the noise signal is not larger than the predetermined threshold, wherein the noise detection unit has a cardioid characteristic, wherein the noise detection unit includes:

a delay unit for delaying one of the first electric signal and the second electric signal by a predetermined time;

a second subtracting unit for producing the noise signal from a difference between delayed one of the first electric signal and the second electric signal and another signal; and a second determination unit for determining whether or not the amplitude of the noise signal is larger than the predetermined threshold.

10. A method of transmitting and receiving a sound signal, comprising:

receiving, a differential microphone, sounds respectively at a first point and a second point;

detecting, by the differential microphone, an acoustic or electric difference between the sounds at each of the first point and the second point;

outputting, by the differential microphone, a differential sound signal;

transmitting, by a transmission-reception unit that is separate from the differential microphone and that forms part of a wireless communication device, a wireless transmitted signal representative of the differential sound signal;

receiving, by the transmission-reception unit, a wireless incoming signal and outputting a received sound signal representative of the wireless incoming signal adding the received sound signal and the differential sound signal to produce an addition signal; and outputting sound based on the addition signal.

11. The sound signal transmitting and receiving method according to claim 10, wherein the step of receiving sounds includes:

converting the sound received at the first point into a first electric signal;

converting the sound received at the second point into a second electric signal; and producing the differential sound signal from a difference between the first electric signal and the second electric signal.

12. The sound signal transmitting and receiving method according to claim 11, further comprising determining whether or not an amplitude or power of a noise signal is larger than a predetermined threshold by extracting the noise signal based on the first electric signal and the second electric signal, wherein the step of producing the addition signal includes the steps of:

adding the differential sound signal to the received sound signal when the amplitude or power of the noise signal is larger than the predetermined threshold; and adding one of the first electric signal and the second electric signal to said reception the received sound signal when the amplitude or power of the noise signal is not larger than the predetermined threshold.

13. A sound signal transmitter-receiver comprising:

a differential microphone for receiving sounds respectively at first and second points to convert the receiving sounds into a transmission sound signal by detecting an acoustic or electric difference between the receiving sounds;

a transmission-reception unit for receiving an incoming signal as a reception sound signal and transmitting the transmission sound signal, wherein the transmission-reception unit is part of a wireless communication device;

an addition unit configured to add the reception sound signal from the transmission-reception unit and the transmission sound signal to produce an addition signal;

a speaker configured to output sound based on the addition signal;

a first microphone converting the sound received at the first point into a first electric signal;

a second microphone converting the sound received at the second point into a second electric signal:

a signal production unit for producing said transmission sound signal from a difference between the first electric signal and the second electric signal;

a noise detection unit for determining whether or not an amplitude or power or a noise signal is larger than a predetermined threshold by extracting the noise signal based on the first electric signal and the second electric signal; and a second switching unit for switching a signal fed into the addition unit based on a determination result, wherein the second switching unit feeds the transmission sound signal into the addition unit when the amplitude or power of the noise signal is larger than a predetermined threshold.

* * * * *

UNITED STATES PATENT AND TRADEMARK OFFICE

CERTIFICATE OF CORRECTION

PATENT NO. : 8,379,884 B2
APPLICATION NO. : 12/355356
DATED : February 19, 2013
INVENTOR(S) : Ryusuke Horibe et al.

It is certified that error appears in the above-identified patent and that said Letters Patent is hereby corrected as shown below:

In the Claims:

- Claim 1, column 22, line number 9, the phrase “second points to convert said receiving sounds” should be omitted.

- Claim 1, column 22, lines 22-23, the phrase “said transmission” should be omitted.

- Claim 10, column 24, line 25, the phrase “receiving a differential microphone” should read -- receiving, by a differential microphone --.

- Claim 12, column 24, line 60, the phrase “the steps of” should be omitted.

Signed and Sealed this
Fifth Day of November, 2013

Teresa Stanek Rea
*Deputy Director of the United States Patent and Trademark Office*